United States Patent
Koyama

(10) Patent No.: US 7,268,331 B2
(45) Date of Patent: Sep. 11, 2007

(54) SOLID-STATE IMAGING DEVICE, METHOD FOR DRIVING THE SAME, AND CAMERA

(75) Inventor: Eiji Koyama, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 167 days.

(21) Appl. No.: 10/866,594

(22) Filed: Jun. 10, 2004

(65) Prior Publication Data

US 2004/0251396 A1    Dec. 16, 2004

(30) Foreign Application Priority Data

Jun. 10, 2003  (JP) .............................. 2003-165744

(51) Int. Cl.
*H01L 27/00* (2006.01)
*H04N 3/14* (2006.01)

(52) U.S. Cl. .................................. 250/208.1; 348/301
(58) Field of Classification Search ............. 250/208.1; 348/308

See application file for complete search history.

(56) References Cited

U.S. PATENT DOCUMENTS

| | | | | |
|---|---|---|---|---|
| 6,512,544 | B1 * | 1/2003 | Merrill et al. | 348/302 |
| 6,518,910 | B2 * | 2/2003 | Sakuragi et al. | 341/162 |
| 6,590,611 | B1 * | 7/2003 | Ishida et al. | 348/310 |
| 2001/0008268 | A1 * | 7/2001 | Funakoshi | 250/208.1 |
| 2001/0013899 | A1 * | 8/2001 | Watanabe | 348/294 |
| 2002/0024068 | A1 * | 2/2002 | Shinohara | 257/225 |
| 2002/0158982 | A1 * | 10/2002 | Kokubun et al. | 348/308 |
| 2003/0035059 | A1 * | 2/2003 | Suzuki | 348/362 |
| 2003/0080340 | A1 * | 5/2003 | Henderson et al. | 257/72 |
| 2004/0141076 | A1 | 7/2004 | Ueno et al. | |
| 2005/0036050 | A1 | 2/2005 | Ueno et al. | |
| 2005/0036051 | A1 | 2/2005 | Ueno et al. | |
| 2005/0041127 | A1 | 2/2005 | Ueno et al. | |

FOREIGN PATENT DOCUMENTS

JP    11-355668    12/1999
KR    2000-0005962    1/2000

* cited by examiner

*Primary Examiner*—Georgia Epps
*Assistant Examiner*—Kevin Wyatt
(74) *Attorney, Agent, or Firm*—David G. Conlin, Esq.; David A. Tucker, Esq.; Edwards Angell Palmer & Dodge LLP

(57) ABSTRACT

A solid-state imaging device comprises: an imaging section including a plurality of unit pixel portions arranged along a row direction and a column direction, each of the plurality of the unit pixel portions including a charge storage section, a reset section for resetting the charge storage section, a photoelectrical conversion section, a transfer section for transferring the charge, which is photoelectrically converted by the photoelectrical conversion section, to the charge storage section, and a signal outputting section for outputting a signal corresponding to the charge stored in the charge storage section, and is provided so as to share at least a part thereof with at least a part of the reset section; a vertically scanning section for vertically scanning the plurality of unit pixel portions on a row basis: and a driving voltage control section for controlling a driving voltage.

18 Claims, 20 Drawing Sheets

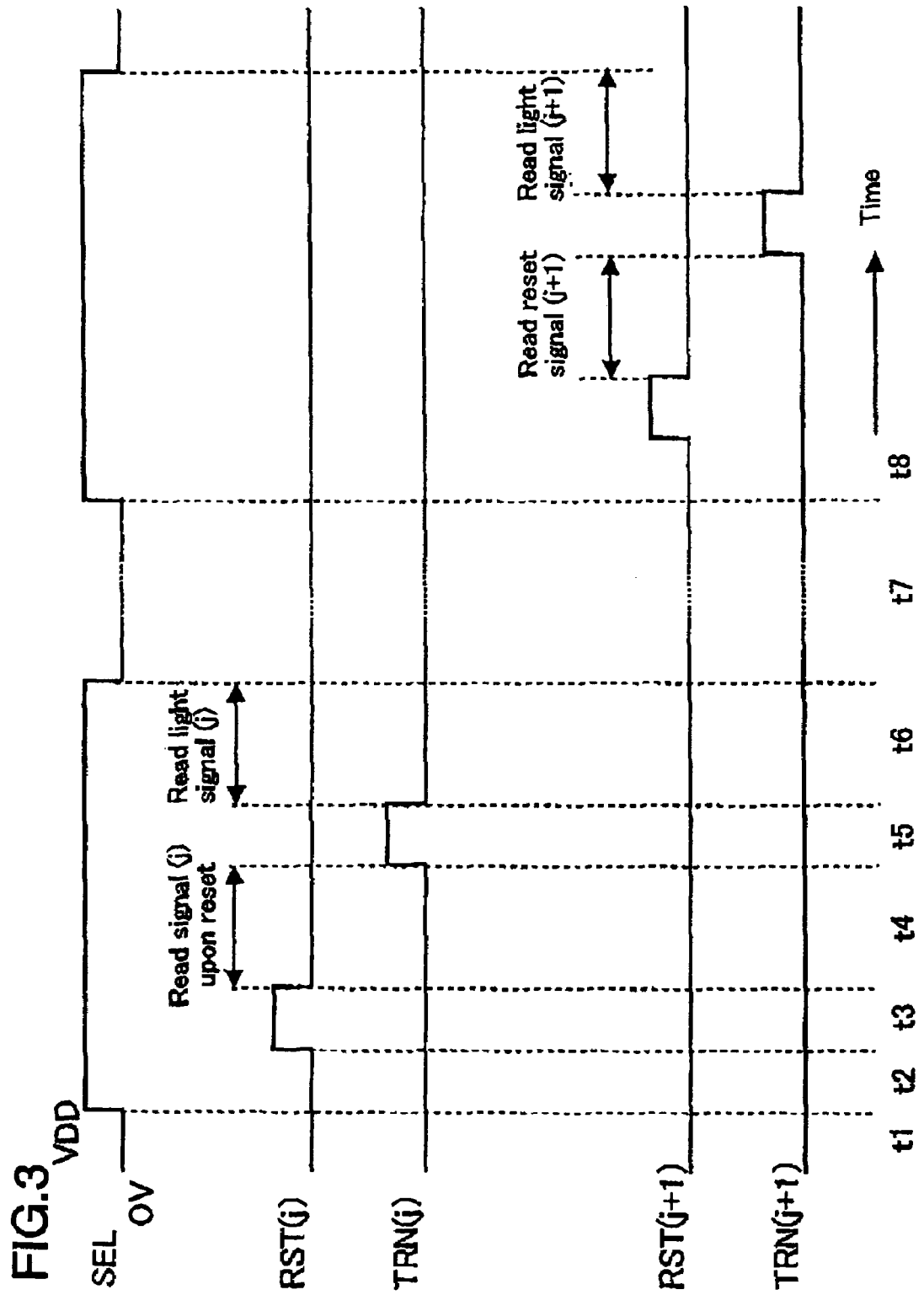

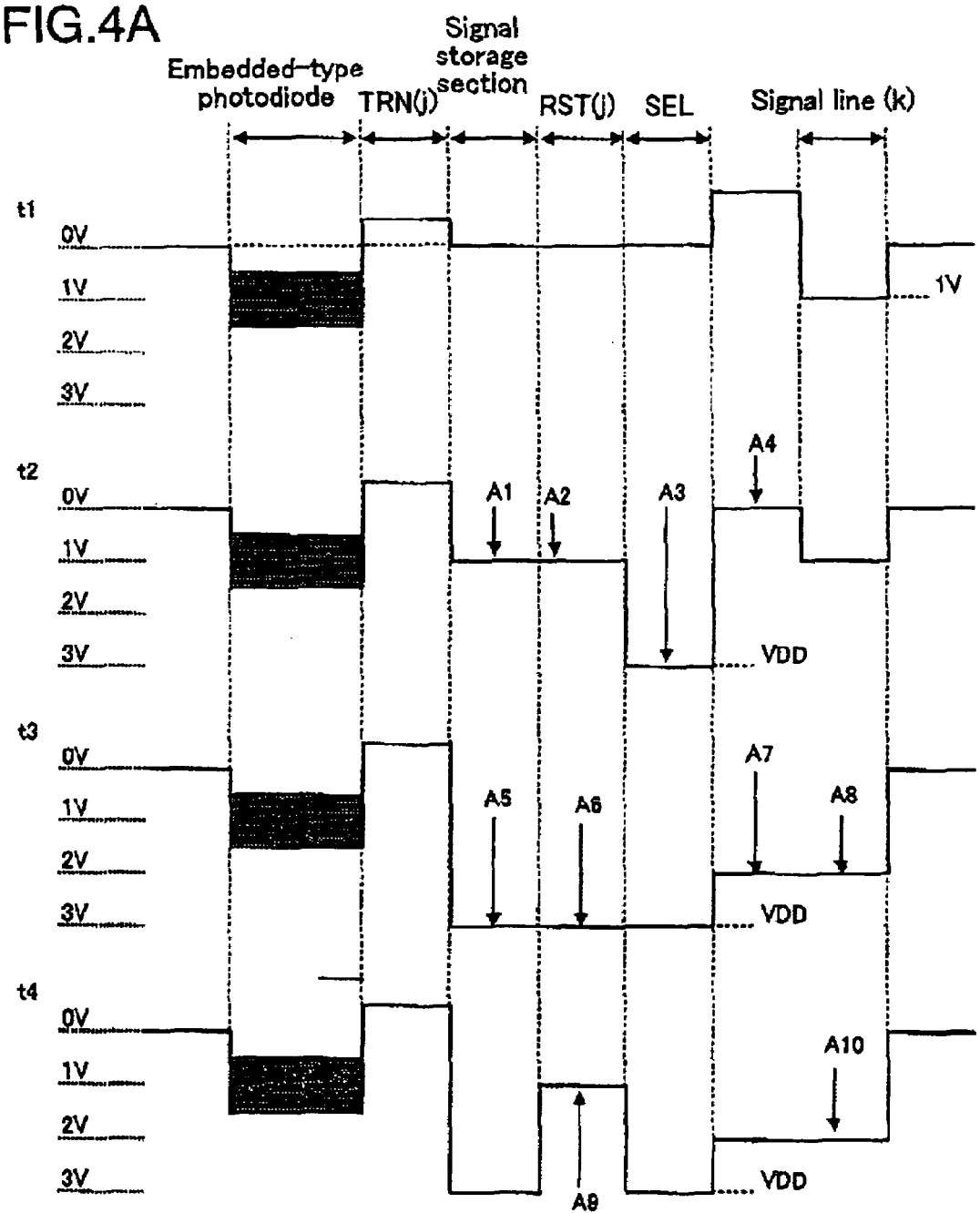

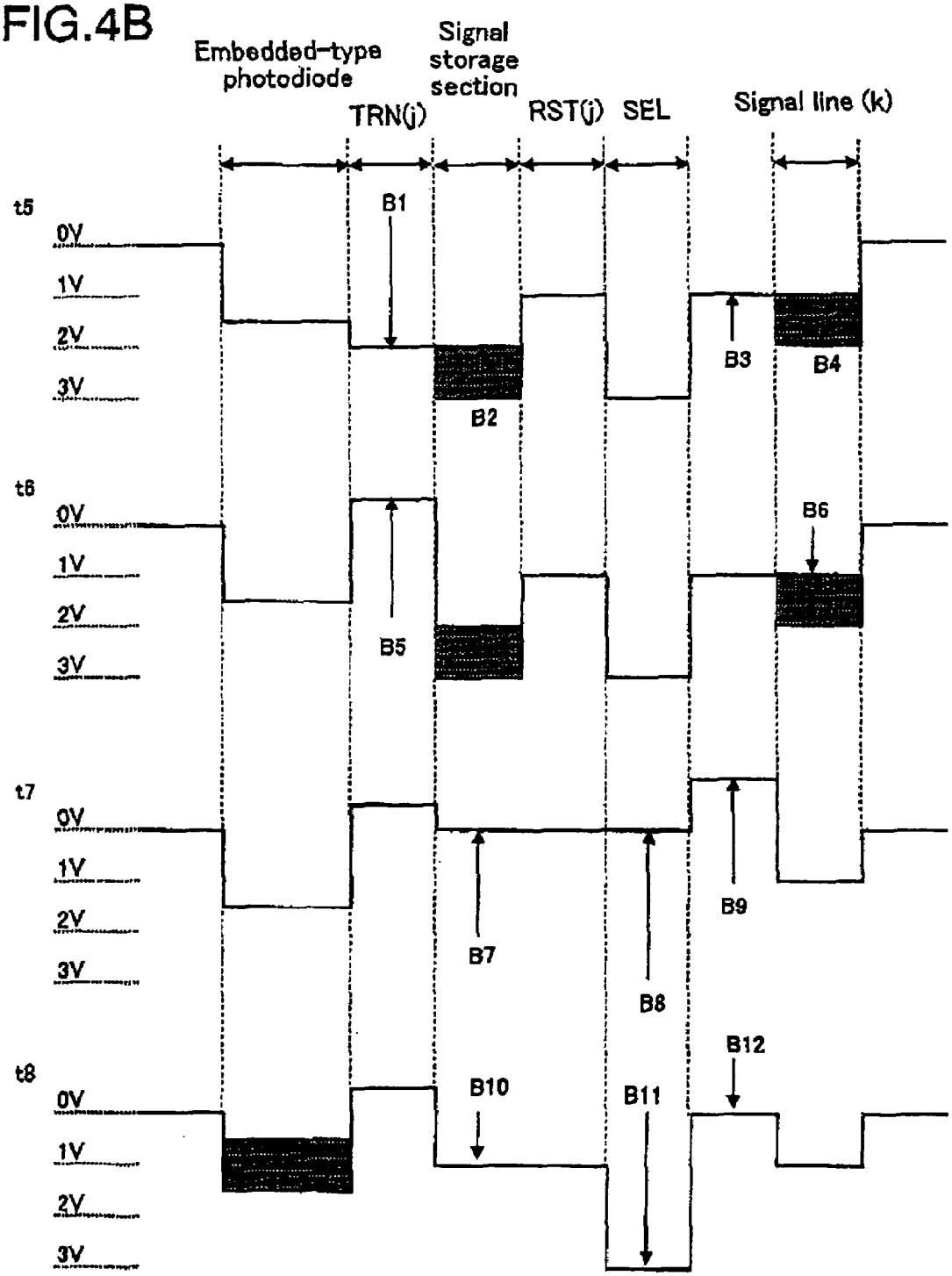

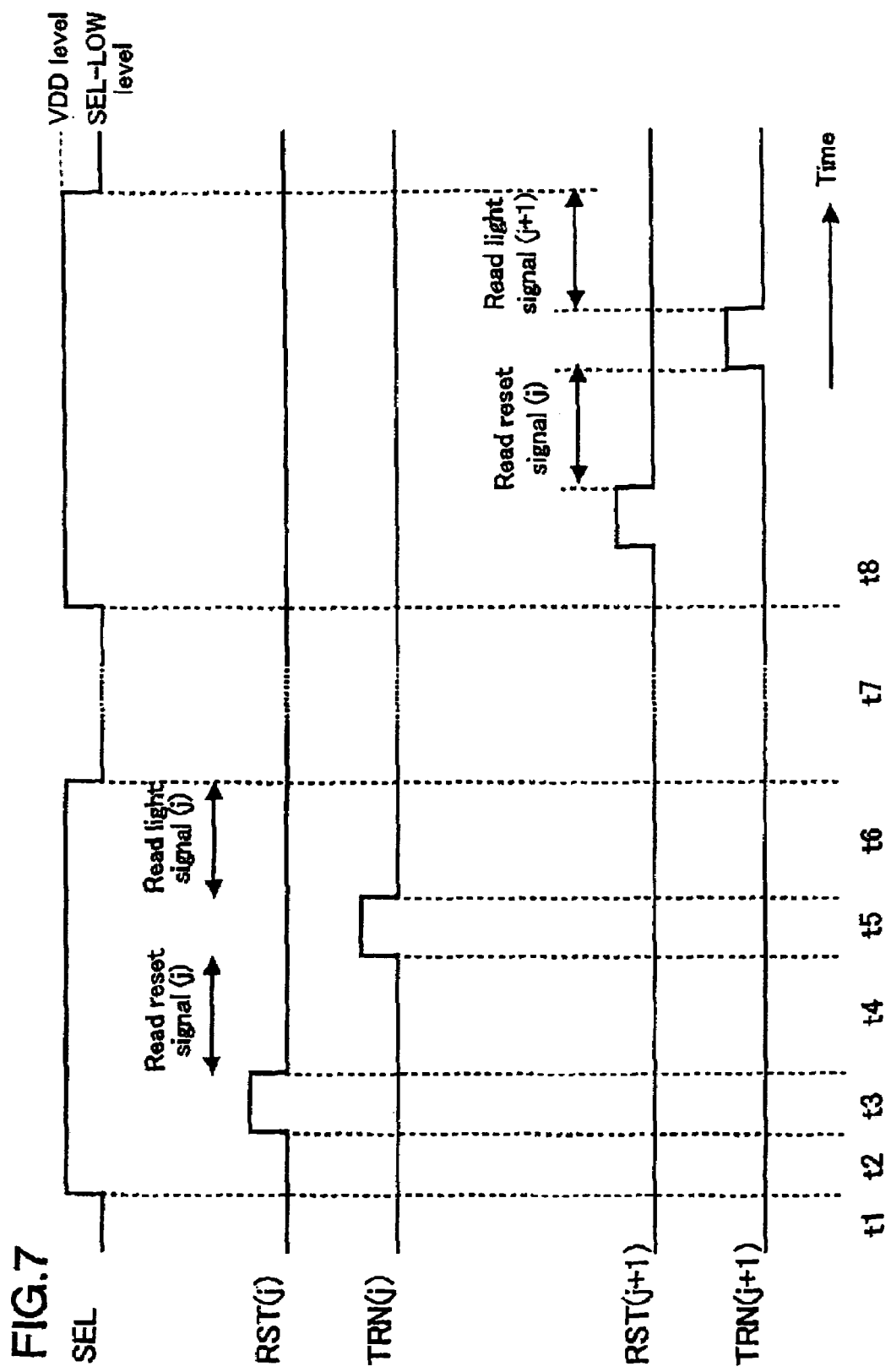

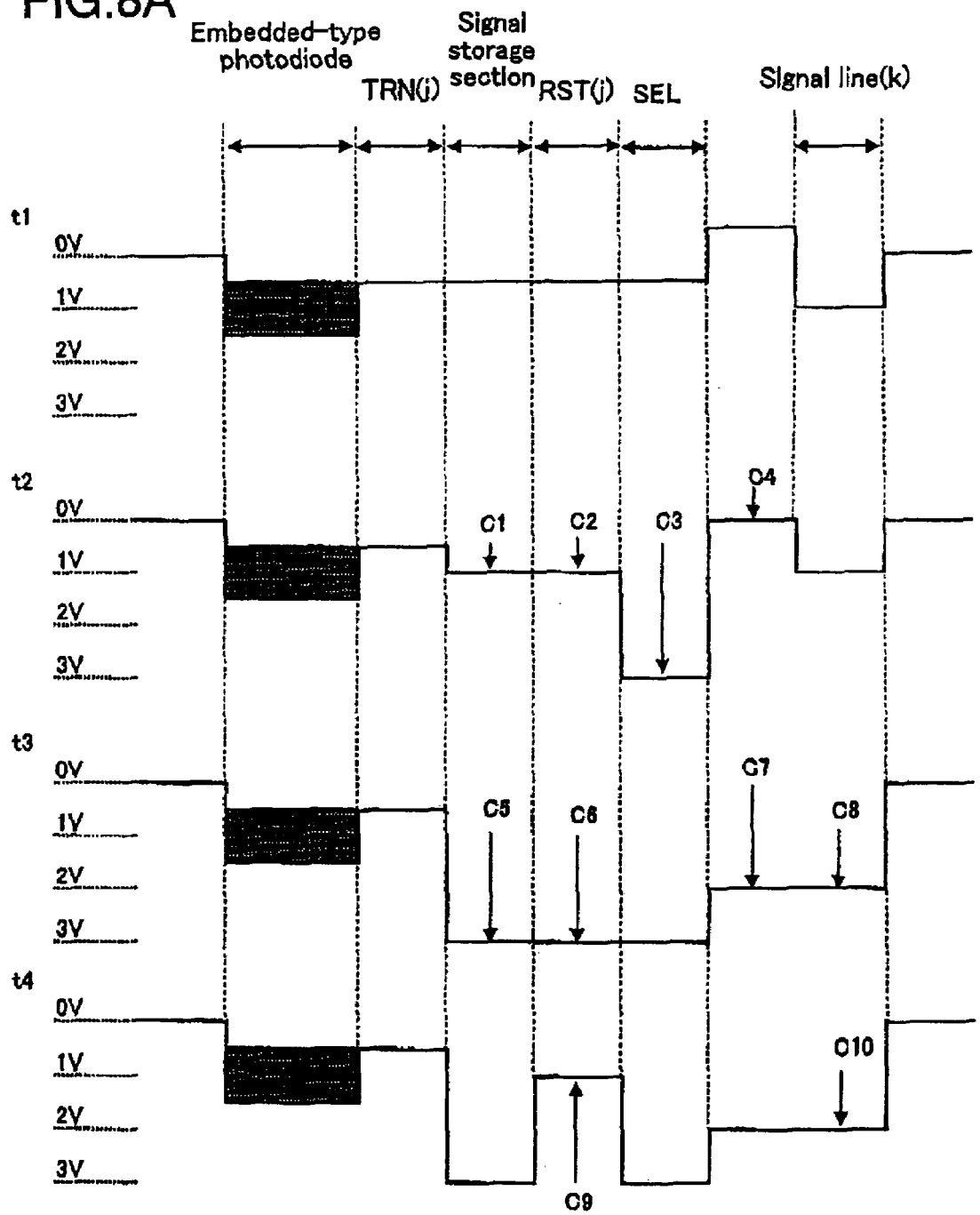

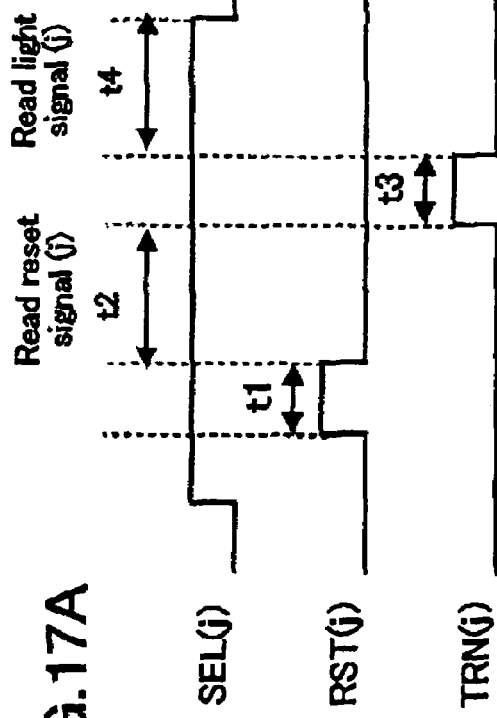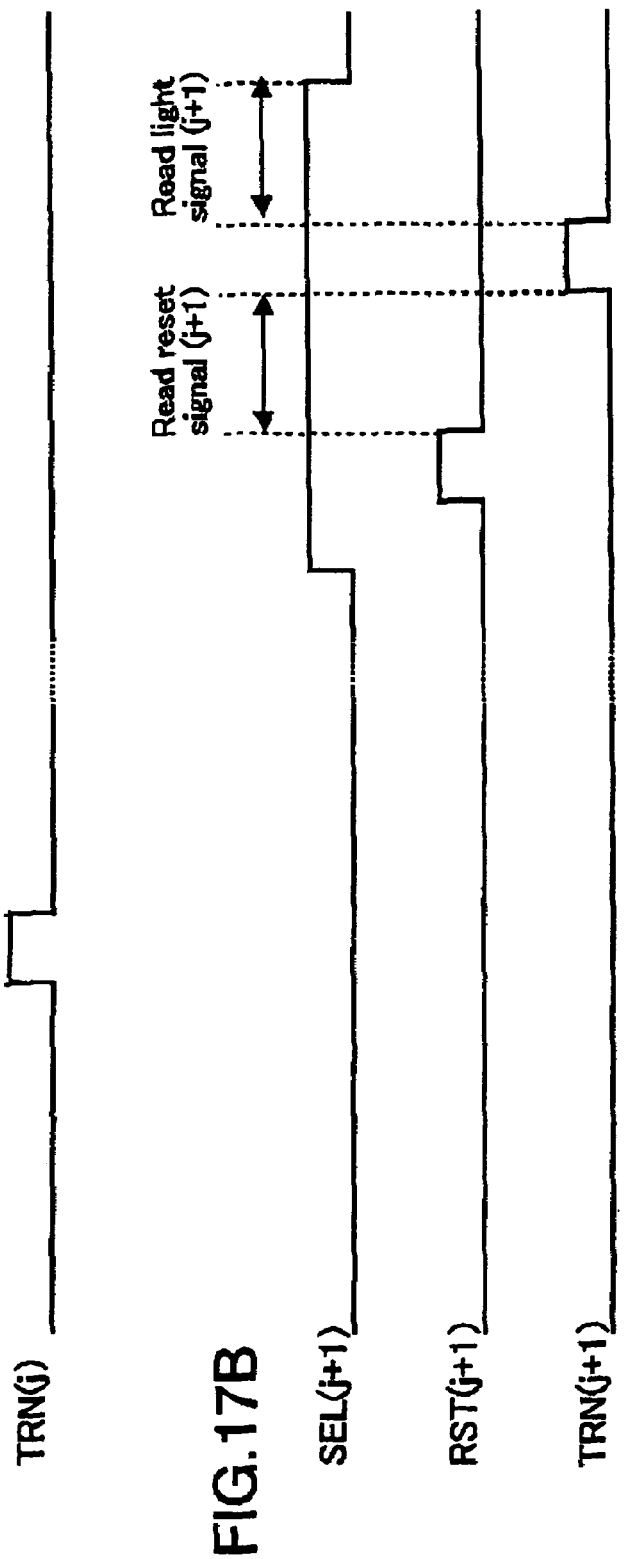
FIG.17A
FIG.17B

SOLID-STATE IMAGING DEVICE, METHOD FOR DRIVING THE SAME, AND CAMERA

This Nonprovisional application claims priority under 35 U.S.C. §119(a) on Patent Application No. 2003-165744 filed in Japan on Jun. 10, 2003, the entire contents of which are hereby incorporated by reference.

BACKGROUND OF THE INVENTION

1. Field of the Invention

The present invention relates to a solid-state imaging device, a method for driving the same, and a camera. More specifically, the present invention relates to a solid-state imaging device which uses a MOS-type image sensor or the like, and used in, for example, a video camera, an electron camera and an image input camera, a scanner, a facsimile machine, or the like, a method for driving the same, and a camera using such a solid-state image sensing device.

2. Description of the Related Arts

Conventionally, a semiconductor image sensor such as a CCD type image sensor, a MOS-type image sensor and the like have been used as image input devices in various electronic devices, such as, a video camera, an electron camera, an image input camera, a scanner, a facsimile machine, or the like.

In recent years, a MOS-type image sensor has been drawing attention once again because of its benefits. The power consumption is low, and it can be produced using a CMOS technique which is the same an that for the surrounding circuits. Further, in order to compensate for lower image quality than that of the CCD-type image sensor, it is becoming popular to employ a structure called an embedded-type photodiode structure. This is used in a MOS-type image sensor instead of a surface photodiode structure which had been initially used. The embedded-type photodiode structure is the structure used in a CCD-type image sensor. Such a structure is employed to reduce a dark current component and it is becoming possible to achieve a high-quality image.

Hereinafter, a conventional MOS-type image sensor employing such an embedded-type photodiode structure will be described with reference to FIGS. 12 through 14.

First, a structure of a unit pixel of a MOS-type image sensor will be described with reference to FIGS. 12 and 13.

FIG. 12 is a circuit diagram showing a structure of a unit pixel portion (address (k, j)) in a conventional MOS-type image sensor 200. FIG. 13 is a cross-sectional view showing a semiconductor layer structure which corresponds to the unit pixel portion in FIG. 12.

The MOS-type image sensor 200 includes an imaging section containing a plurality of unit pixel portions (pixel cells), and a vertically scanning circuit 207 for vertically scanning the plurality of unit pixel portions. Each of the unit pixels includes a photodiode 201, a transfer transistor 202, a signal storage section 203, a reset transistor 204, an amplification transistor 205, and a selection transistor 206.

Each of the unit pixel portions includes four transistors (i.e., the transfer transistor 202, the reset transistor 204, the amplification transistor 205, and the selection transistor 206). A plurality of the unit pixel portions are arranged along a row direction and a column direction in two dimensions. FIG. 12 shows only one of the plurality of unit pixels, which is specified by address (k, j).

As shown in FIG. 13, the photodiode 201 has an embedded-type structure. The photodiode 201 includes an N-type (N−) impurity region 221 provided on a P-type well region 220 with a P-type impurity region 222 provided on the N-type impurity region 221. The N-type (N−) impurity region 221 serves as a light receiving portion. By irradiating the N-type impurity region 221 with light, a charge is generated in an amount corresponding to an amount of the irradiation of light. Such a charge may also be referred to as a signal charge herein.

The transfer transistor 202 is provided between the photodiode 201 and the signal storage section 203. The transfer transistor 202 includes the N-type impurity region 221, which serves as a source region, an N-type (N+) impurity region 223a, which serves as a drain region, and a gate electrode 202a which to provided on the P-type well region 220 therebetween.

The gate electrode 202a is connected with a transfer control line 210 which is connected to an output terminal of the vertically scanning circuit 207. From the vertically scanning circuit 207, a transfer control signal TRN (j) is supplied to the gate electrode 202a. In the entire imaging section, the transfer transistors 202 are controlled to be ON/OFF on a row basis. The transfer transistor 202 transfers a charge stored in the photodiode 201 to the signal storage section 203.

The signal storage section 203 is the N-type impurity region 223a of a floating diffusion layer which is provided on the P-type well region 220. The signal storage section 203 stores a signal charge from the photodiode 201 which is transferred by the transfer transistor 202.

The reset transistor 204 is provided between a power supply line 213 and the signal storage section 203. To the power supply line 213, a power supply voltage VDD is applied. The reset transistor 204 includes the N-type impurity region 223a, which serves as a source region, an N-type (N+) impurity region 223b, which serves as a drain region, and a gate electrode 204a which is provided on the P-type well region 220 therebetween.

The gate electrode 204a is connected with a reset control line 209 which is connected to an output terminal of the vertically scanning circuit 207. Prom the vertically scanning circuit 207, a reset control signal RST (j) is supplied to the gate electrode 204a. In the entire imaging section, the reset transistors 204 are controlled to be ON/OFF on a row basis. The reset transistor 204 resets the signal storage section 203.

The amplification transistor 205 is provided between the power supply line 213 and the selection transistor 206. The amplification transistor 205 includes the N-type impurity region 223b, which serves as a drain region, an N-type (N+) impurity region 223c, which serves as a source region, and a gate electrode 205a which in provided on the P-type well region 220 therebetween.

The gate electrode 205a is connected to the signal storage section 203, which is the N-type impurity region 223a. Thus, a potential that is the same as that of the signal storage section 203 in conveyed to the gate of the amplification transistor 205. The amplification transistor 205 outputs a signal corresponding to an amount of a charge stored in the signal storage section 203.

The selection transistor 206 is provided between a signal line (k) 211 and the amplification transistor 205. The signal line (k) 211 is connected to a constant-current source 212 and a signal is read out therethrough. The selection transistor 206 includes the N-type impurity region 223a, which serves as a drain region, an N-type (N+) impurity region 223d, which serves as a source region, and a gate electrode 206a which is provided on the P-type well region 220 therebetween.

The gate electrode 206a of the selection transistor 206 is connected with a vertical selection line 208 which is connected to the output terminal of the vertically scanning circuit 207. From the vertically scanning circuit 207, a vertical selection signal SEL (j) is supplied to the gate electrode 206a. In the entire imaging section, the selection transistors 206 are controlled to be ON/OFF on a row basis. In the entire imaging section, the unit pixels are selected on a row basis, based on the vertical selection signal SEL (j) applied to the selection transistor 206. A signal is read out through the signal line (k) 211.

In such a MOS-type image sensor 200, the transfer transistor 202 and the reset transistor 204 are often a depletion type transistor, and the amplification transistor 205 and the selection transistor 206 are often an enhancement type transistor.

Next, a method for driving the conventional MOS-type image sensor 200 having a structure as shown in FIGS. 12 and 13 will be described.

FIG. 14 is a signal waveform diagram showing timings to drive the MOS-type image sensor 200.

A basic operation for reading out a signal corresponding to a charge stored in the photodiode 201 of the MOS-type image sensor 200 is as follows.

As shown in FIG. 14, during time period t1, the reset control signal RST (j) to be applied to the gate electrode 204a of the reset transistor 204 is raised to a high level for all the unit pixel portions of selected line j to turn on the reset transistor 204. Thus, a potential of the signal storage section 203 is reset to the power supply voltage VDD via the reset transistor 204.

Next, during time period t2, the vertical selection signal SEL (j) to be applied to the gate electrode 206a of the selection transistor 206 is raised to the high level to turn on the selection transistor 206. Thus, the amplification transistor 205 and the constant-current source 212 provided for every column (k) form a source follower circuit. A signal is output to the signal line (k). The signal which is output represents a signal corresponding to an amount of a charge stored in the signal storage section 203 which has been reset.

Further, during time period t3, the transfer control signal TRN (j) to be applied to the gate electrode 202a of the transfer transistor 202 is raised to the high level to turn on the transfer transistor 202. Thus, a charge corresponding to a light signal which is photoelectrically converted by the photodiode 201 is completely transferred to the signal storage section 203 via the transfer transistor 202.

Immediately after, during time period t4, the vertical selection signal SEL (j) to be applied to the gate electrode 206a of the selection transistor 206 is again raised to the high level to turn on the selection transistor 206. Thus, the amplification transistor 205 and the constant-current source 212 provided for every column (k) form a source follower circuit. A signal is output to the signal line (k). The signal which is output represents a signal corresponding to an amount of a charge corresponding to the light signal.

Then, a clamp circuit, a differential amplification circuit, or the like (not shown) are used to detect a difference between the signal corresponding to the amount of the charge and the signal, upon the reset. By utilizing the detected results, variances in offsets of transistors among the pixels can be cancelled out. Further, since the light signal can be completely transferred from the photodiode 201 to the signal storage section 203, no random noise is generated and a high quality image can be obtained.

In this example, the reset signal RST (j), the vertical selection signal SEL (j), and the transfer control signal TRN (j) are pulse signals having a binary level of the power supply voltage VDD and the ground voltage GND. In general, these signals are supplied from the vertically scanning circuit 207 located around the imaging section.

In the conventional MOS-type image sensor 200 having the embedded-type photodiode structure as shown in FIGS. 12 and 13, four transistors are required for each unit pixel. In the MOS-type image sensor employing the conventional surface photodiode structure, three transistors are required for each unit pixel. Thus, the number of transistors increases by one by employing the embedded-type photodiode structure. This means that the size of the photodiode is reduced by the size of one transistor in each unit pixel. This results in a decrease in the sensitivity.

In order to solve such a problem of the decrease in the sensitivity due to the increase of the transistors, Japanese Laid-Open Publication No. 11-355668, for example, proposes a structure having three transistors for each unit pixel.

Now, the structure of the MOS-type image sensor disclosed in Japanese Laid-Open Publication No. 11-355668 will be described.

First, a structure of a unit pixel of the MOS-type image sensor will be described with reference to FIGS. 15 and 16.

FIG. 15 in a circuit diagram showing a structure of two unit pixel portions in a conventional MOS-type image sensor 300 disclosed in Japanese Laid-Open Publication No. 11-355668. These unit pixel portion, are specified by address (k, j) and (k, j+1). FIG. 16 is a croon-sectional view showing a semiconductor layer structure which corresponds to one of the unit pixel portions in FIG. 15.

As shown in FIG. 15, the MOS-type image sensor 300 includes an imaging section containing a plurality of unit pixel portions (pixel cells) and a vertically scanning circuit 307. The vertically scanning circuit 307 vertically scans the unit pixel portions. Each unit pixel portion includes one embedded-type photodiode 301, a transfer transistor 302, a signal storage section 303, a reset transistor 304, and an amplification transistor 305. In the MOS-type image sensor 300, each unit pixel portion includes three transistors (i.e., the transfer transistor 302, the reset transistor 304, and the amplification transistor 305). A plurality of the unit pixel portions are arranged along a row direction and a column direction in two dimensions.

The MOS-type image sensor 300 disclosed in the Japanese Laid-Open Publication No. 11-355668 is different from the conventional MOS-type image sensor 200 shown in FIGS. 12 and 13 on the following points.

An N-type (N+) impurity region 323e serves as a drain region of the reset transistor 304. An N-type (N+) impurity region 323f serves as a drain region of the amplification transistor 305. Between the N-type impurity region 323e and the N-type impurity region 323f, a P-type (P+) impurity region 322a is provided to separate them from each other. A drain voltage of the reset transistor 304 is controlled by a vertical selection signal SEL (j) supplied from the vertically scanning circuit 307.

Further, in the MOS-type image sensor 300, the selection transistor 206 shown in FIG. 12 is not provided. An N-type (N+) impurity region 323g, which serves as a source region of the amplification transistor 305, is directly connected with a signal line 311.

The reset transistor 304 is of the depletion type, and the transfer transistor 302 and the amplification transistor 305 are of the enhancement type.

Next, a method for driving the MOS-type image sensor 300 disclosed in Japanese Laid-Open Publication No. 11-355668 will be described.

FIGS. 17A and 17B are signal waveform diagrams showing timings to drive the MOS-type image sensor 300. FIG. 17A shows a signal waveform at line j. FIG. 17B shows a signal waveform at line j+1.

As shown in FIGS. 17A and 17B, for the selected line J, through which a signal is output, the same operation as that for the selected line in the MOS-type image sensor 200 shown in FIG. 12 is performed.

On the other hand, at a non-selected line, when the drain voltage of the reset transistor 304 is maintained at a low level, for example, 0V, the depletion-type reset transistor 304 fixes a potential at the signal storage section 303, to the 0V level. The signal storage section 303 is connected to a gate electrode 305a of the amplification transistor 305. Thus, the gate voltage of the amplification transistor 305 becomes 0V, and the drain and the source of the amplification transistor 305 at the non-selected line are blocked.

Therefore, in the entire imaging section, the drain voltages of the react transistors 304 can be controlled on a row basis to allow the gate voltages of the amplification transistors 305 at the non-selected line to be controlled. For example, as described above, a line, for which the drain voltage of the reset transistor 304 is set to 0V, becomes a non-selected line which is not operated. As a result, it is not necessary to provide the selection transistor 206 (see FIG. 12) which has been required conventionally.

As described above, in the conventional MOS-type image sensor 200 having the embedded-type photodiode structure as shown in FIGS. 12 and 13, an amount of a dark current is small. However, four transistors are required for each pixel, thereby causing a problem of a decrease in sensitivity due to a reduction in the size of the photodiode area. Therefore, in the MOS-type image sensor 200, there is a trade-off between the suppression of the dark current and the decrease in sensitivity.

As disclosed in Japanese Laid-Open Publication No. 11-355668, the MOS-type image sensor 300 including three unit pixel portions has been proposed. By comparing the MOS-type image sensor 200 (FIG. 13) and the MOS-type image sensor 300 (FIG. 16), it is apparent that, the number of transistors is reduced by one, more specifically, the selection transistor 306 is omitted in the MOS-type image sensor 300. However, the P-type impurity region 322a is required as a drain separation region for separating the power supply voltage VDD of the unit pixel portion and a drain voltage of the reset transistor 304. Thus, the size of the area is not reduced.

SUMMARY OF THE INVENTION

According to one aspect of this invention, there is provided a solid-state imaging device comprising; an imaging section including a plurality of unit pixel portions arranged along a row direction and a column direction, each of the plurality of the unit pixel portions including a charge storage section for storing a charge, a reset section for resetting the charge storage section, a photoelectrical conversion section for photoelectrically converting light to a charge, a transfer section for transferring the charge, which is photoelectrically converted by the photoelectrical conversion section, to the charge storage section, and a signal outputting section for outputting a signal corresponding to the charge stored in the charge storage section, and in provided so as to share at least a part thereof with at least a part of the reset section; a vertically scanning section for vertically scanning the plurality of unit pixel portions on a row basis by applying a control voltage for controlling the reset section and the transfer section of each of the plurality of the unit pixel portions; and a driving voltage control section for controlling a driving voltage for driving the reset section and the signal output section of each of the plurality of the unit pixel portions.

In one embodiment of the present invention, the reset section may include a control voltage application portion to which the control voltage is applied by the vertically scanning section and a one-side driving voltage application portion to which the driving voltage is applied by the driving voltage control section; the transfer section may include a control voltage application portion to which the control voltage is applied by the vertically scanning section; and the signal output section may include a control voltage application portion and a one-side driving voltage application portion to which the driving voltage is applied by the driving voltage control section.

In one embodiment of the present invention, the one-side driving voltage application portion of the reset section and the one-side driving voltage application portion of the signal outputting section may be common.

In one embodiment of the present invention, the photoelectrical conversion section may be formed of a photodiode which generates a charge by irradiation of light.

In one embodiment of the present invention, the photodiode may have an embedded-type photodiode structure.

In one embodiment of the present invention, the transfer section may be formed of a transfer transistor; the reset section may be formed of a reset transistor; and the signal output section may be formed of an amplification transistor.

In one embodiment of the present invention, the imaging section may further include a vertical selection line shared by unit pixel portions arranged along the column direction among the plurality of unit pixel portions; and the driving voltage control section may be connected to the reset transistor and the amplification transistor via the vertical selection line.

In one embodiment of the present invention, the vertical selection line may be a light shielding wiring for shielding irradiation of light.

In one embodiment of the present invention, the driving voltage control section may supply a pixel power supply voltage to the amplification transistor.

In one embodiment of the present invention, the charge storage section may be a floating diffusion layer.

In one embodiment of the present invention, the reset transistor may be a depletion type transistor.

In one embodiment of the present invention, the transfer transistor may be either an enhancement type transistor or a depletion type transistor.

In one embodiment of the present invention, the amplification transistor may be an enhancement type transistor.

In one embodiment of the present invention, the transfer transistor may be provided between the photodiode and the charge storage section, the reset transistor may be provided between the vertical selection line connected to the driving voltage control section and the charge storage section; the amplification transistor may be provided between the signal line which is connected to a constant-current source, and through which the signal is read out, and the vertical selection line, the control voltage application portion of the amplification transistor may be connected to the charge storage section; the control voltage application portion of the reset transistor may be connected to a reset control line connected to the vertically scanning section; and the control voltage application portion of the transfer transistor may be connected to a transfer control line connected to the vertically scanning section.

In one embodiment of the present invention, the driving voltage control section may output a voltage signal indicating a level of a binary driving voltage having a power supply voltage level as a high level and a ground voltage level as a low level.

In one embodiment of the present invention, wherein the driving voltage control section may output a binary voltage signal having a power supply voltage level as a high level, and a constant voltage level, which is higher than a potential under the control voltage application portion of the transfer transistor when the control voltage thereof in 0V and which is lower than a potential under the control voltage application portion of the reset transistor when the control voltage thereof is 0V.

In one embodiment of the present invention, the driving voltage control section may comprise a voltage generation circuit having: a source follower circuit formed of a transistor that is the same as the reset transistor; and a differential amplification circuit.

In one embodiment of the present invention, the voltage generation circuit may generate a constant voltage level.

According to another aspect of this invention, there is provided a method for driving a solid-state imaging device, wherein the solid-state imaging device comprises: an imaging section including a plurality of unit pixel portions arranged along a row direction and a column direction, each of the plurality of the unit pixel portions including a charge storage section for storing a charge, a reset section for resetting the charge storage section, a photoelectrical conversion section for photoelectrically converting light to a charge, a transfer section for transferring the charge, which is photoelectrically converted by the photoelectrical conversion section, to the charge storage section, and a signal outputting section for outputting a signal corresponding to the charge stored in the charge storage section, and is provided so an to share at least a part thereof with at least a part of the reset section; a vertically scanning section for vertically scanning the plurality of unit pixel portions on a row basis, by applying a control voltage for controlling the reset section and the transfer section of each of the plurality of the unit pixel portions; and a driving voltage control section for controlling a driving voltage for driving the reset section and the signal output section of each of the plurality of the unit pixel portions, the method comprising the steps of: resetting the charge storage section; outputting a signal corresponding to the charge stored in the reset charge storage section; storing the charge photoelectrically converted by the photoelectric conversion section via the transfer section into the charge storage section; and outputting a signal corresponding to the charge which is photoelectrically converted by the photoelectrical conversion section and stored in the charge storage section, wherein the steps of storing the charge in the charge storage section and resetting, include the stop of controlling the driving voltage for driving the reset section and the signal output section by the driving voltage control section to select unit pixel portions on a row basis.

According to still another aspect of this invention, there is provided a camera comprising a imaging device, wherein the imaging device is an imaging section including a plurality of unit pixel portions arranged along a row direction and a column direction, each of the plurality of the unit pixel portions including a charge storage section for storing a charge, a reset section for resetting the charge storage section, a photoelectrical conversion section for photoelectrically converting light to a charge, a transfer section for transferring the charge which is photoelectrically converted by the photoelectrical conversion section to the charge storage section, and a signal outputting section for outputting a signal corresponding to the charge stored in the charge storage section, and is provided so as to share at least a part thereof with at least a part of the reset section; a vertically scanning section for vertically scanning the plurality of unit pixel portions on a row basis by applying a control voltage for controlling the reset section and the transfer section of each of the plurality of the unit pixel portions; and a driving voltage control section for controlling a driving voltage for driving the reset section and the signal output section of each of the plurality of the unit pixel portions.

Now, effects of the present invention, obtained by the above-described structure, will be described.

According to the present invention, the solid-state imaging device includes a plurality of unit pixel portions. Each of the unit pixel portions includes a photodiode (photoelectrical conversion section), a signal storage section composed of a floating diffusion layer, and three transistors (i.e., a transfer transistor (transfer section), a reset transistor (reset section), and an amplification transistor (signal output section)). The plurality of unit pixel portions are arranged along a row direction and a column direction in two dimensions.

According to such a structure, it is possible to reduce the size of the area occupied by the transistors in the unit pixel portions compared to that in the conventional art which requires four transistors, including a selection transistor. It is also possible to increase the size of the area occupied by the photodiode. Thus, the sensitivity in imaging can be improved.

Further, according to the present invention, a drain of the reset transistor (one-side driving voltage application portion) and a drain of the amplification transistor (one-side driving voltage application portion) are common. Thus, compared to the conventional art which requires a P-type impurity region for separating the drain region of the amplification transistor from the drain region of the reset transistor, the size of the area occupied by the transistors in the unit peel portions can be reduced. Thus, the size of the area occupied by the photodiode can be increased to further improve the sensitivity in imaging.

In the entire imaging section, a vertically scanning section scans the plurality of unit pixel portions, on a row basis, by applying a gate voltage (control voltage) of the reset transistor and a gate voltage (control voltage) of the transfer transistor. Thus, a charge transfer process from the photodiode to the signal storage section and a reset process from the signal storage section can be controlled.

In the entire imaging section, the unit pixel portions are selected on a row basis by the vertically scanning portion which scans the plurality of unit pixel portions. Further, the one-side driving voltage (drain voltage) of the reset transistor and the one-side driving voltage (drain voltage) of the amplification transistor, which are commonly coupled, are controlled by a driving voltage control section. In this way, unit pixel portions are specified and it is not necessary to provide a selection transistor as in the conventional art.

The driving voltage control section may also be used as a pixel power supply for supplying a pixel power supply voltage to the drains of the amplification transistors.

Further, the drains of the reset transistors and amplification transistors of all the unit pixel portions are connected to the driving voltage control section by a common vertical selection line. Thus, the number of terminals to be controlled at the vertically scanning section can be reduced compared to that in the conventional art.

The photodiode has an embedded-type photodiode structure. Thus, a dark-current can be suppressed.

The driving voltage control section outputs a voltage signal indicating a level of a binary driving voltage having a power supply voltage (VDD) level as a high level, and a GND (ground) level as a low level. The binary voltage signal is supplied to the drains of each of the reset transistors and the amplification transistors.

In the selected unit pixel portion, a charge from the photodiode is transferred to the signal storage section by the transfer transistor of, for example, an enhancement type. Thus, the gate voltage of the amplification transistor of the enhancement type varies depending upon an amount of the charge of the signal storage section, and an output signal corresponding to a light signal is read through the signal line. A difference between the output signal corresponding to the light signal, and a signal after the signal storage section is reset by the reset transistor, is detected. The detected signal is utilized to generate an output signal without an error.

When a drain voltage is at the low level (for example, 0V) in the reset transistor of a depletion type, the potential of the signal storage section in fixed to 0V. When the potential of the signal storage section is 0V, the amplification transistor of the enhancement type is turned off. The signal line is blocked from the unit pixel portion. Therefore, during reset, transfer, and reading of a signal, the drain voltage of the reset transistor is raised to the high level.

In the non-selected unit pixel portion, transfer or reset is not performed. Thus, even when the drain voltage of the reset transistor, of the depletion type, is at a high level, and the charge of the signal storage section to raised, the potential is maintained at about 1V because such a period is short. The amplification transistor of the enhancement type is in an off state, and the unit pixel portion remains blocked from the signal line. Therefore, the signal line is not affected by the non-selected unit pixel portions even though a selection transistor is not provided as in the conventional art.

The transfer transistor can be of the enhancement type. However, in the case where the transfer transistor is of the depletion type, even an excessive amount of a charge is stored in the photodiode when the intensity is high, the gate of the transfer transistor of the depletion type forms an overflow path for flowing charge to the signal storage section.

In this case, the driving voltage control section outputs the voltage signal indicating the level of the binary driving voltage which has the power supply voltage (VDD) level as the high level and a constant level, which is higher than the GND level, as the low level. The charge flowing into the signal storage section, flows through the region under the gate of the reset transistor to a vertical control signal line connected to the drain of the reset transistor.

A voltage generation circuit for generating the low level of the constant level, which is higher than the GND level, is formed of a source follower circuit and a differential amplification circuit. The source follower circuit in formed of a transistor which is the same as the reset transistor. Thus, fine adjustments of a variance in the voltage conditions due to the variance in the process of the transistor are possible.

The camera according to the present invention employs the solid-state imaging device as an imaging device. Thus, better sensitivity in imaging can be achieved and a high quality image can be obtained.

Thus, the invention described herein makes possible the advantages of providing: a solid-state imaging device where the size of an area occupied by the transistors in a unit pixel portion is reduced, while the sensitivity in imaging is improved; the method for driving the same; and the camera system using the solid-state imaging device.

These and other advantages of the present invention will become apparent to those skilled in the art upon reading and understanding the following detailed description with reference to the accompanying figures.

BRIEF DESCRIPTION OF THE DRAWINGS

FIG. 3 is a signal waveform diagram showing timings to drive the MOS-type image sensor shown in FIG. 1B;

FIG. 4A is a diagram showing potentials at each part at the timings (t1-t4) to drive the MOS-type image sensor shown in FIG. 1B;

FIG. 4B is a diagram showing potentials at each part at the timings (t5-t8) to drive the MOS-type image sensor shown in FIG. 1B;

FIG. 7 is a signal waveform diagram showing timings to drive the MOS-type image sensor shown in FIG. 5;

FIG. 8A to a diagram showing potentials at each part at the timings (t1-t4) to drive the MOB-typo image sensor shown in FIG. 5;

FIG. 17A is a signal waveform diagram showing timings to drive the MOS-type image sensor shown in FIG. 15 at a line j; and FIG. 17B is a signal waveform diagram showing timings to drive the MOS-type image sensor shown in FIG. 15 at a line j+1.

DESCRIPTION OF THE PREFERRED EMBODIMENTS

Hereinafter, Examples 1 through 3 of the present invention will be described with reference to the drawings.

EXAMPLE 1

Figure 1A:
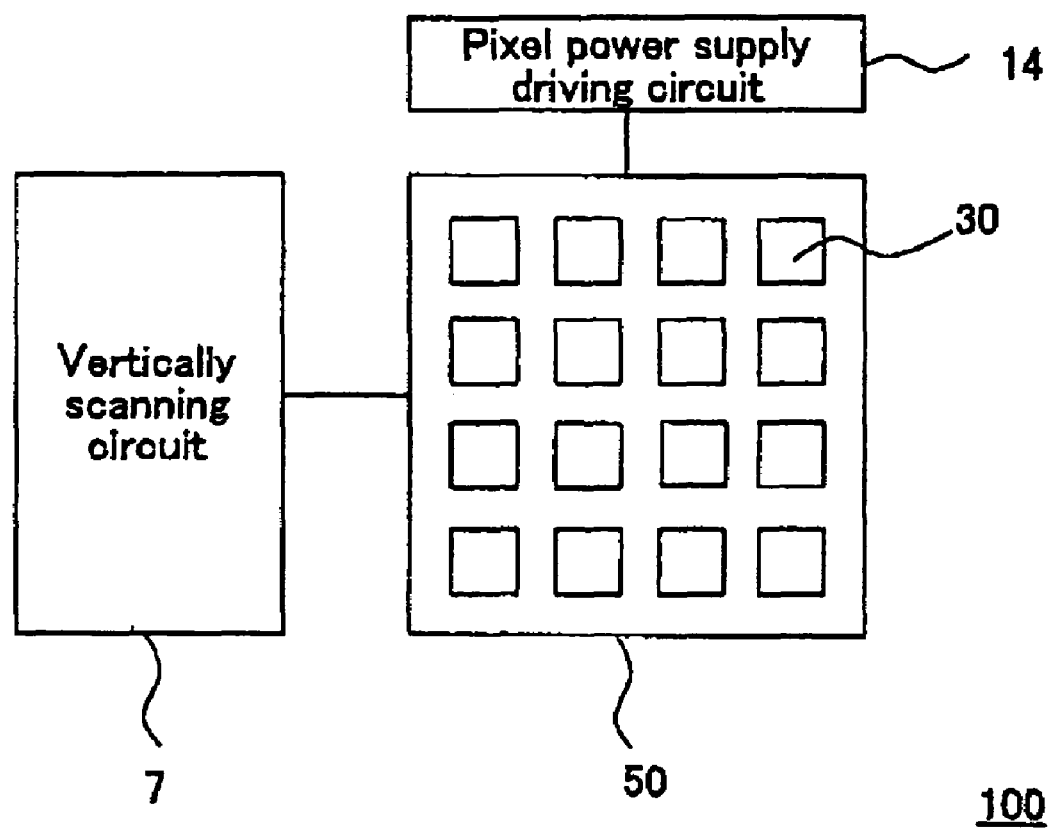
FIG. 1A is a schematic block diagram showing a MOS-type image sensor as an example of a solid-state imaging device according to Example 1 of the present invention.

FIG. 1A is a schematic block diagram showing a MOS-type image sensor 100 as an example of a solid-state imaging device according to Example 1 of the present invention.

The MOS-type image sensor 100 includes an imaging section 50 including a plurality of unit pixel portions (pixel cells) 30, a vertically scanning circuit 7 which serves an a vertically scanning section, and a pixel power supply driving circuit 14 which serves as a driving voltage control section.

The plurality of unit pixel portions 30 are arranged along a row direction and a column direction in two dimensions (in a matrix).

Figure 1B:
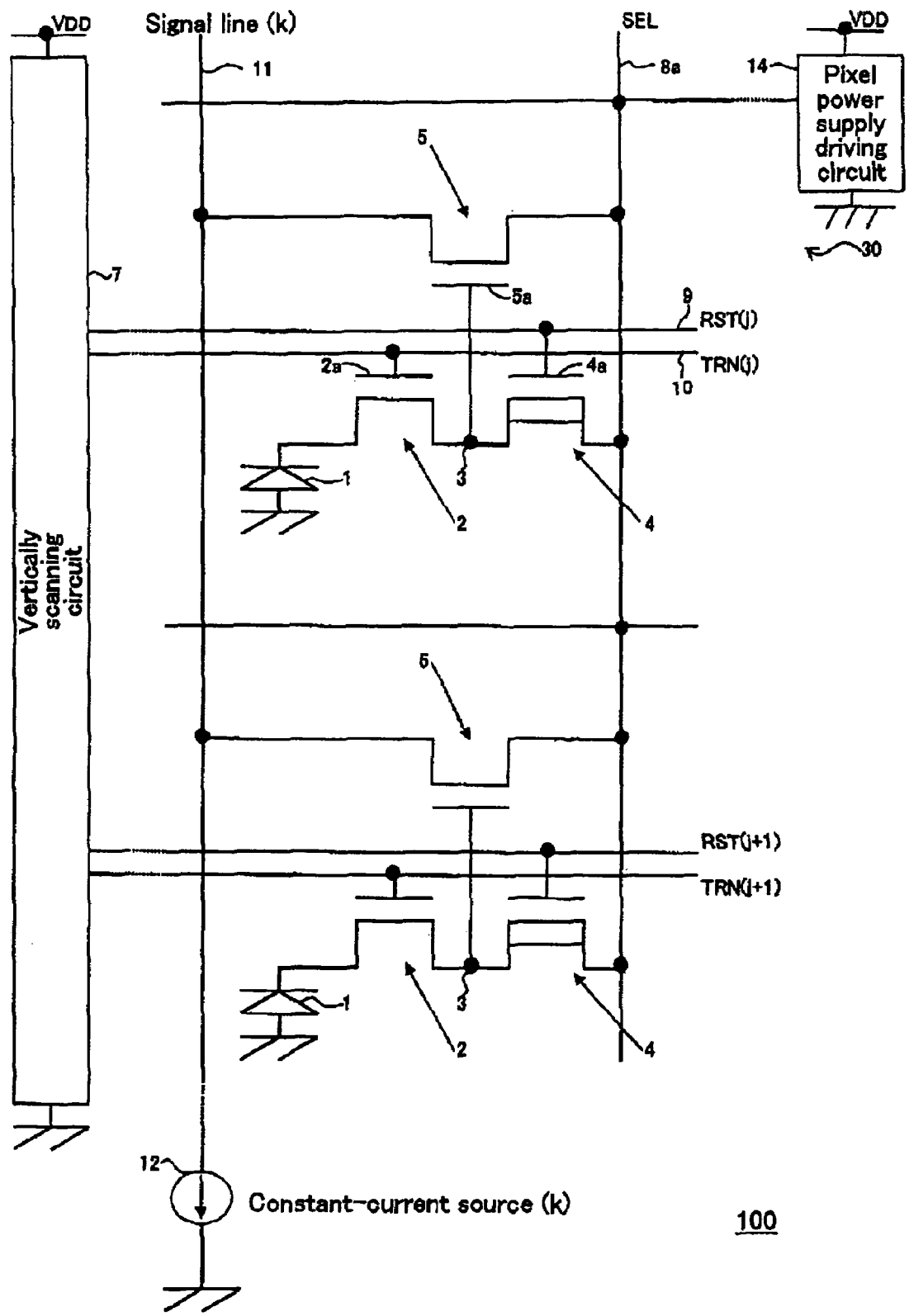
FIG. 1B is a circuit diagram showing structures of two of the unit pixel portions in the MOS-type image sensor in a solid-state imaging device according to Example 1 of the present invention.

FIG. 1B is a circuit diagram showing structures of two of the unit pixel portions in the MOS-type image sensor 100. FIG. 1B shows only two of the plurality of unit pixel portions 30, which are specified by address (k, j) and (k, j+1).

Figure 2A:
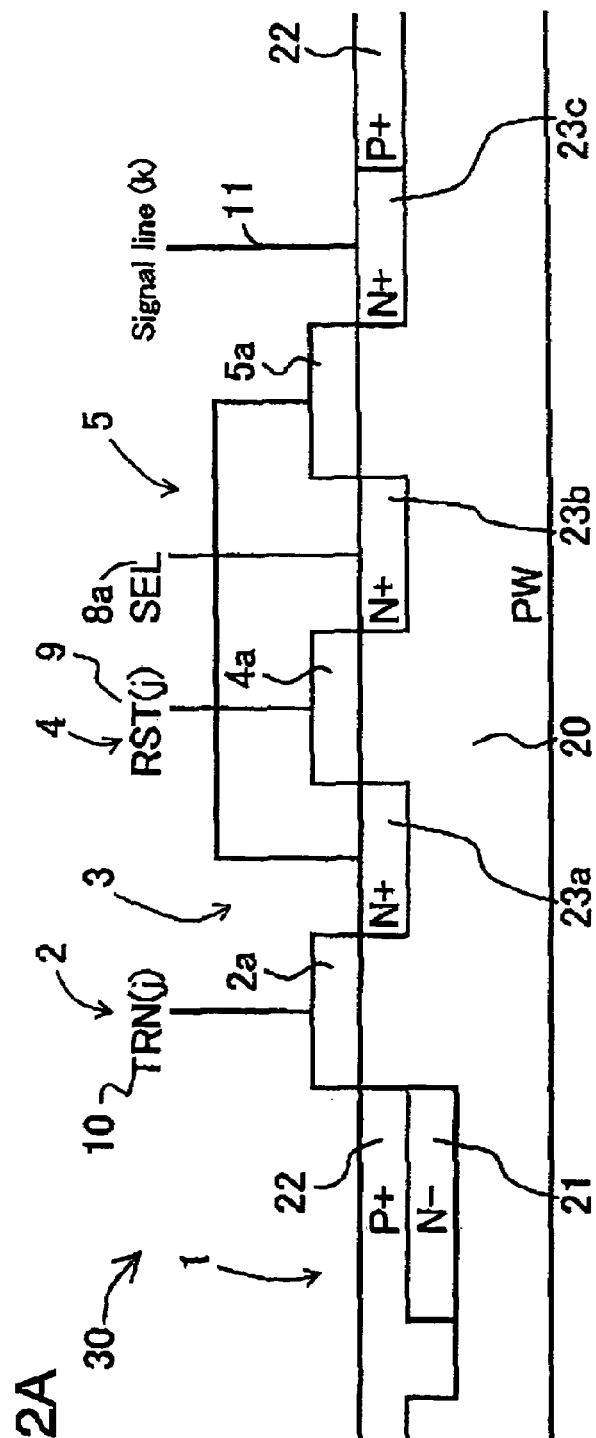
FIG. 2A is a cross-sectional view showing a semiconductor layer structure of a unit pixel portion as shown in FIG. 1B.
Figure 2B:
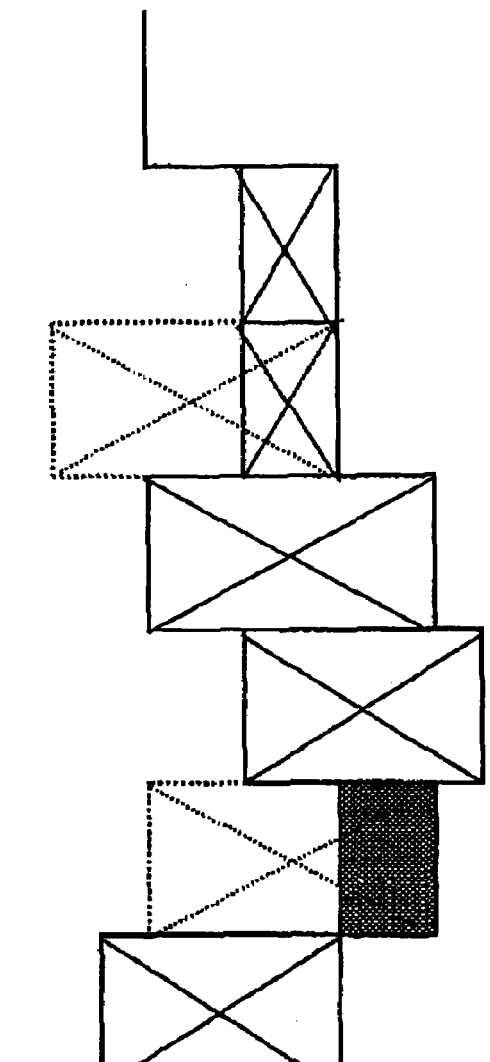
FIG. 2B is a diagram showing potentials which may be taken by the parts shown in FIG. 2A.

FIG. 2A to a cross-sectional view showing a semiconductor layer structure as shown in FIG. 1B. FIG. 2B is a diagram showing potentials which may be taken by the parts shown in FIG. 2A. FIGS. 2A and 2B show only one of the plurality of pixel portions 30.

As shown in FIGS. 1B and 2A, the unit pixel portion 30 of the MOS-type image sensor 100 includes a photodiode 1 which serves as a photoelectric conversion section, a transfer transistor 2 which serves as a transfer section, a signal storage section 3, a reset transistor 4 which serves as a reset section, and an amplification transistor 5 which serves as a signal output section. One unit pixel portion 30 includes three transistors (i.e., the transfer transistor 2, the reset transistor 4, and the amplification transistor 5).

As shown in FIGS. 1B and 2A, in the unit pixel portion 30, the reset transistor 4 and the amplification transistor 5 are provided so as to share at least some parts with each other. More specifically, a drain region of the reset transistor 4 and a drain region of the amplification transistor 5 are common. The drain region of the reset transistor 4 serves as a one-side driving voltage application portion of the reset transistor 4. The drain region of the amplification transistor 5 serves as a one-side driving voltage application portion of the amplification transistor 5.

A pixel power supply driving circuit 14 for controlling a drain voltage as a driving voltage is provided separately from the vertically scanning circuit 7. The driving voltage is for driving the reset transistor 4 and the amplification transistor 5.

The pixel power supply driving circuit 14 outputs a voltage signal of a binary pulse (SEL). The signal has two levels, i.e., a power supply voltage level (VDD) which is high (for example, 3V), and a ground voltage level (GND) which is low (for example, 0V).

The photodiode 1 has an embedded-type photodiode structure. The photodiode 1 includes an N-type (N−) impurity region 21 provided on a P-type well region 20 with a P-type impurity region 22 provided on the N-type impurity region 21. The N-type (N−) impurity region 21 serves as a light receiving portion.

By irradiating the N-type impurity region 21 with light, a charge of an amount corresponding to an amount of the irradiation of light is generated. As shown in FIG. 2B, a potential of the photodiode 1 varies within the range of 0.5 V to 1.5 V, depending upon the amount of the irradiation of light. The hatched pattern of the photodiode 1 as shown in FIG. 2B indicates changes in the potential due to an amount of signal storage.

The transfer transistor 2 is provided between the photodiode 1 and the signal storage section 3. The transfer transistor 2 includes the N-type impurity region 21, which serves as a source region, an N-type (N+) impurity region 23a, which serves as a drain region, and a gate electrode 2a which is provided on the P-type well region 20 therebetween.

The gate electrode 2a serves as a control voltage application section. The gate electrode 2a is connected with a transfer control line 10 which is connected to an output terminal of a vertically scanning circuit 7. From the vertically scanning circuit 7, a transfer control signal TRN (j) is supplied to the gate electrode 2a. In the entire imaging section, the transfer transistors 2 are controlled to be ON/OFF on a row basis. The vertically scanning circuit 7 applies a control voltage represented by the transfer control signal TRN (j) to the transfer transistor 2 and controls the transfer transistor 2.

The transfer transistor 2 transfers a charge stored in the photodiode 1 to the signal storage section 3. Such a charge represents a light signal received by the photodiode 1. The charge may also be referred to as a signal charge herein. Herein, the signal storage section 3 may also be referred to as a charge storage section.

The transfer transistor 2 is of the enhancement type. As shown in FIG. 2B, the potential under the gate of the transfer transistor 2 varies within the range of −0.5V to 2V, depending upon a change in a potential to be applied to the gate electrode 2a.

The signal storage section 3 is the N-type impurity region 23a of a floating diffusion layer which is provided on the P-type well region 20. The signal storage section 3 stores a charge from the photodiode 1 which is transferred by the transfer transistor 2. As shown in FIG. 2B, for example, a potential at the signal storage section 3 varies within the range of 0V to 2V, or 0V to 3V, in accordance with an amount of the charge transferred from the photodiode 1. The potential is varied due to a change in a voltage to be applied to the drain region 23b of the reset transistor 4. As shown in FIG. 2B, the signal storage section 3 may take a potential indicated by the dotted line, and a potential indicated by the hatched pattern indicates a potential change due to signal storage.

The reset transistor 4 in provided between a vertical selection line 8a and the signal storage section 3. The vertical selection line 8a is connected to an output terminal of the pixel power supply driving circuit 14. The reset transistor 4 includes the N-type impurity region 23a, which serves as a source region, an N-type (N+) impurity region 23b, which serves as a drain region, and a gate electrode 4a which is provided on the P-type well region 20 therebetween.

The gate electrode 4a is connected with a reset control line 9 which is connected to an output terminal of the vertically scanning circuit 7. The gate electrode 4a serves as the control voltage application section. From the vertically scanning circuit 7, a reset control signal RST (j) is supplied to the gate electrode 4a. In the entire imaging section, the reset transistors 4 are controlled to be ON/OFF on a row basis. The vertically scanning circuit 7 applies a control voltage represented by the reset control signal RST (j) to the reset transistor 4 to control the reset transistor 4.

The reset transistor 4 resets the signal storage section 3. Further, based on the reset control signal RST (j) which is output from the vertically scanning circuit 7, in the entire imaging section, a plurality of the unit pixel portions 30 are selected on a row basis. A vertical selection signal SEL, supplied by the pixel power supply driving circuit 14, is output to the drain region of the reset transistor 4. Thus, a signal is read through the signal line (k) 11. The vertical selection signal SEL can also be used as a pixel power supply voltage which is to be supplied to the drain region of the amplification transistor 5.

The reset transistor 4 is of the depletion type. As shown in FIG. 2B, a potential under the gate of the reset transistor 4 varies within the range of 1V to 3.5V, depending upon a change in a potential to be applied to the gate electrode 4a. A potential of the drain region 23b varies within the range of 0V to 3V, depending upon a change in a potential applied to the drain region 23b.

The amplification transistor 5 is provided between a signal line (k) 11 and the vertical selection line 8a. The signal line (k) 11 is connected to a constant-current source 12 and through which a signal is read out. The vertical selection line 8a is connected to the pixel power supply driving circuit 14. The amplification transistor 5 includes the N-type impurity region 23b, which serves as a drain region, an N-type (N+) impurity region 23c, which serves as a source region, and a gate electrode 5a which is provided on the P-type well region 20 therebetween.

The gate electrode 5a is connected to the signal storage section 3. Thus, a potential that is the same as that of the signal storage section 3 is conveyed to the gate of the amplification transistor 5. The amplification transistor 5 outputs a signal corresponding to an amount of a charge stored in the signal storage section 3 to the signal line (k) 11.

The amplification transistor 5 in of the enhancement type. A potential under the gate of the amplification transistor 5 is different for a selected pixel and for a non-selected pixel.

In the selected pixel, the potential to be applied to the drain region 23b varies and the potential at the signal storage section 3 varies. Thus, as shown in FIG. 2B, the potential varies within the range of −1V to 2V, or −1V to 1V, in accordance with an amount of the charge transferred from the photodiode 1 to the signal storage section 3 and stored therein.

In the non-selected pixel, the potential to be applied to the drain region 23b also varies and the potential at the signal storage section 3 varies. The potential varies within the range of −1V to 1V.

The potential of the signal line (k) 11 varies within the range of 1V to 2V, in accordance with the amount of the charge transferred from the photodiode 1 to the signal storage section 3 and stored therein.

Next, a method for driving the MOS-type image sensor according to Example 1, which has the structure as described above, will be described.

FIG. 3 is a signal waveform diagram showing timings to drive the MOS-type image sensor 100. FIGS. 4A and 4B are diagrams showing potentials at each part at the timings to drive the MOS-type image sensor 100. In this example, during an operation of the MOS-type image sensor 100, a line selected for outputting a light signal is indicated by a line j, and a non-selected line to indicated by a line j+1. An operation at the line j and changes in the potentials thereof will be described.

As shown in FIG. 3, at time t1, all the control signals (i.e. the vertical selection signal SEL, the reset control signals RST (j) and RST (j+1), and the transfer control signals TRN (j) and TRN (j+1)) are at a low level. The vertical selection signal SEL to be applied to the drain region 23b of the reset transistor 4 is 0V (i.e., the low level). In this case, the potential at the signal storage section 3 becomes lower than the potential under the gate of the reset transistor 4 of the depletion type, when the gate voltage thereof is 0V. A charge is injected to the signal storage section 3 by the vertical selection signal SEL. Thus, the potential at the signal storage section 3 also becomes 0V.

Since the signal storage section 3 is 0V, the gate voltage of the amplification transistor 5 of the enhancement type is 0V. The signal line (k) 11 is blocked from the unit pixel portion 30 and is in a floating state in terms of potential. For example, in FIG. 4A, the signal line (k) 11 is shown to be 1V in the floating state.

Next, at time t2, as indicated by an arrow A3 in FIG. 4A, the vertical selection signal SEL to be applied to the drain region 23b of the reset transistor 4 becomes VDD (i.e., a high level). As indicated by an arrow A2, when the gate voltage of the reset transistor 4 of the depletion type is 0V, the potential under the gate thereof becomes 1V.

The potential at the signal storage section 3 is raised by a sub-threshold current flowing through the region under the gate of the reset transistor 4 of the depletion type to the drain region 23b. However, since it takes only about few μs to flow, the potential hardly changes. The potential is maintained at about 1V, as indicated by an arrow A1.

The gate potential of the amplification transistor 5 also becomes 1V at the same time as the signal storage section 3. Since the amplification transistor 5 is of the enhancement type, the potential under the gate of the amplification transistor 5 is about 0V as indicated by an arrow A4. Thus, the signal line (k) 11 remains in the floating state.

At time t3, in the selected line j, the reset control signal RST (j), to be applied to the gate electrode 4a of the reset transistor 4, is raised to the high level, i.e., VDD, as indicated by an arrow A6. As indicated by an arrow A5, the potential at the signal storage section 3 also becomes VDD, i.e., 3V. Thus, the gate voltage of the amplification transistor 5 becomes 3V. As indicated by arrows A7 and A8, the region under the gate of the amplification transistor 5 and the signal line (k) 11 are 2V when the gate voltage of the amplification transistor 5 is 3V.

At time t4, as indicated by an arrow A9, the reset control signal RST (j) to be applied to the gate electrode 4a of the reset transistor 4 is returned to the low level, i.e., 0V. The potential of the signal line (k) 11 indicated by an arrow A10 is an output signal when the unit pixel portion 30 (address (k, j)) is reset.

At time t5, in the selected line j, as indicated by an arrow B1 in FIG. 4B, the transfer control signal TRN (j) to be applied to the gate electrode 2a of the transfer transistor 2 in raised to the high level. A charge is completely transferred from the photodiode 1 to the signal storage section 3. As indicated by an arrow B2, the potential at the signal storage section 3 in decreased by an amount corresponding to the transferred charge. In this example, the potential at the signal storage section 3 is decreased by 1V from 3V to be 2V.

The gate voltage of the amplification transistor 5 is also decreased by 1V. Thus, as shown by arrows B3 and B4, the potential under the gate of the amplification transistor 5 and the potential of the signal line (k) 11 are also decreased by 1V. In this example, the potentials are decreased by 1V from 2V to be 1V.

At time t6, as indicated by an arrow B5, the transfer control signal TRN (j) to be applied to the gate electrode 2a of the transfer transistor 2 is returned to the low level. The potential of the signal line (k) 11 indicated by an arrow B6 is an output signal which corresponds to an amount of the charge of the unit pixel portion 30 (address (k, j)).

At time t7, as indicated by an arrow B8, the vertical selection signal SEL to be applied to the drain region 23b of the reset transistor 4 becomes 0V. As indicated by an arrow B9, the potential under the gate of the amplification transistor 5 is lower than the potential under the gate of the reset transistor 4 of the depletion type when the gate voltage thereof is 0V, i.e. , 1V. Thus, a charge is injected into the signal storage section 3 by the vertical selection signal SEL. As indicated by an arrow B7, the potential of the signal storage section 3 becomes 0V.

Since the potential of the signal storage section 3 is 0V, the gate voltage of the amplification transistor 5 of the enhancement type becomes 0V. The signal line (k) 11 is blocked from the unit pixel portion 30 and is in a floating state in terms of potential. Thus, the potentials return to the state at time t1.

Then, a horizontal scanning period continues for a while. After signals are read from all the unit pixel portions 30 connected to the line j, the line j+1 is selected. The time, when the period for which the line j+1 is selected starts, is time t8.

At time t8, in the line j, as in time t2, as indicated by an arrow B11, the vertical selection signal SEL to be applied to the drain region 23b of the reset transistor 4 becomes VDD (i.e., the high level). The potential at the signal storage section 3 is raised by a sub-threshold current flowing through the region under the gate of the reset transistor 4 of the depletion type, to the drain region 23b. However, the potential hardly changes. As indicated by an arrow B10, the potential is maintained at about 1V.

As indicated by an arrow B12, the potential under the gate of the amplification transistor 5 of the enhancement type is about 0V. Since this is lower than the potential of the signal line (k) 11 and the vertical selection signal SEL, the signal line (k) 11 and the drain region 23b of the amplification transistor 5 can be electrically separated. Thus, the signal line (k) 11 is blocked from the line j. The signal line (k) 11 can be made free from an influence caused by the operation of the line j.

Figure 12:
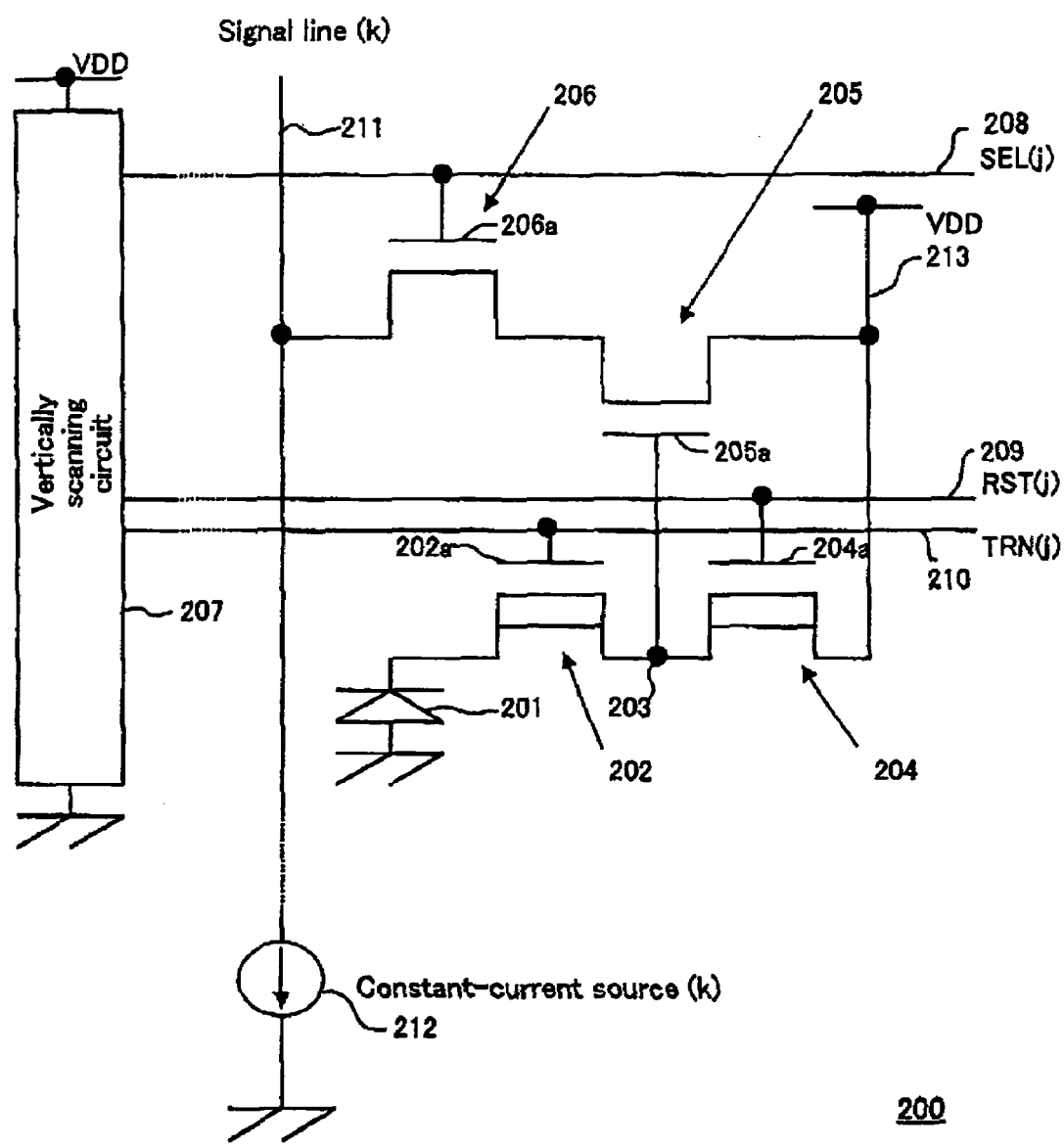
FIG. 12 is a circuit diagram showing a structure of a unit pixel portion (address (k, j)) in a conventional MOS-type image sensor.
Figure 13:
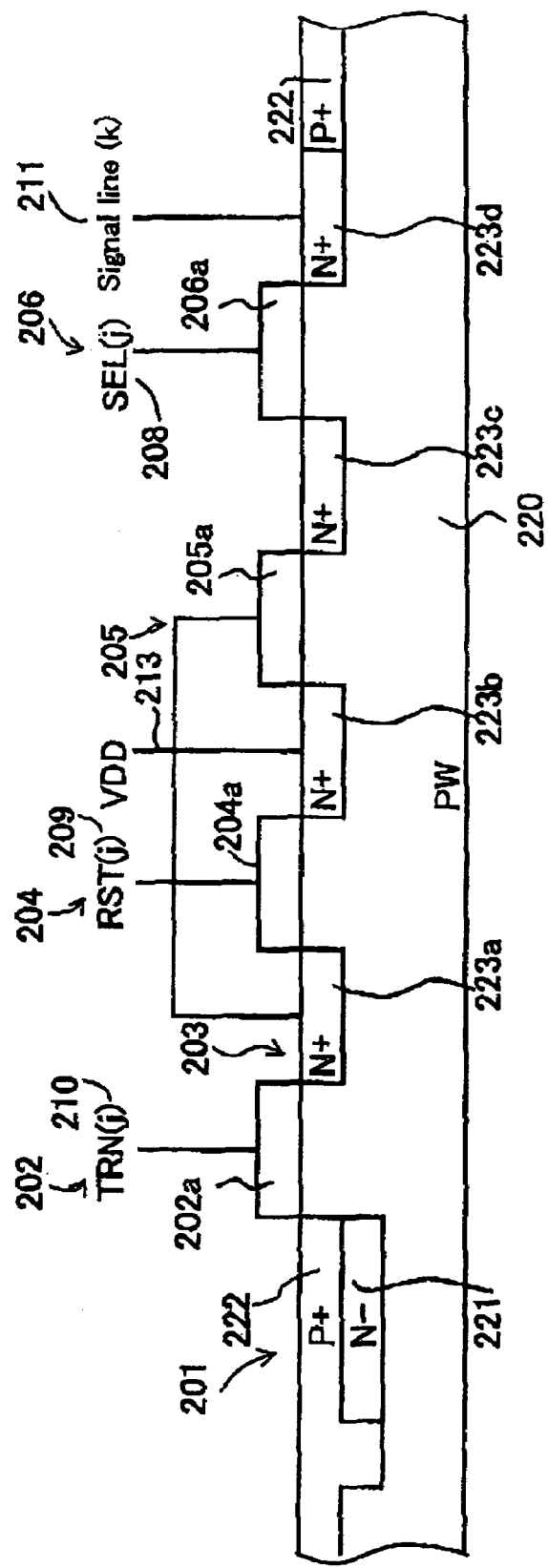
FIG. 13 is a cross-sectional view showing a semiconductor layer structure which corresponds to the unit pixel portion in FIG. 12.
Figure 14:
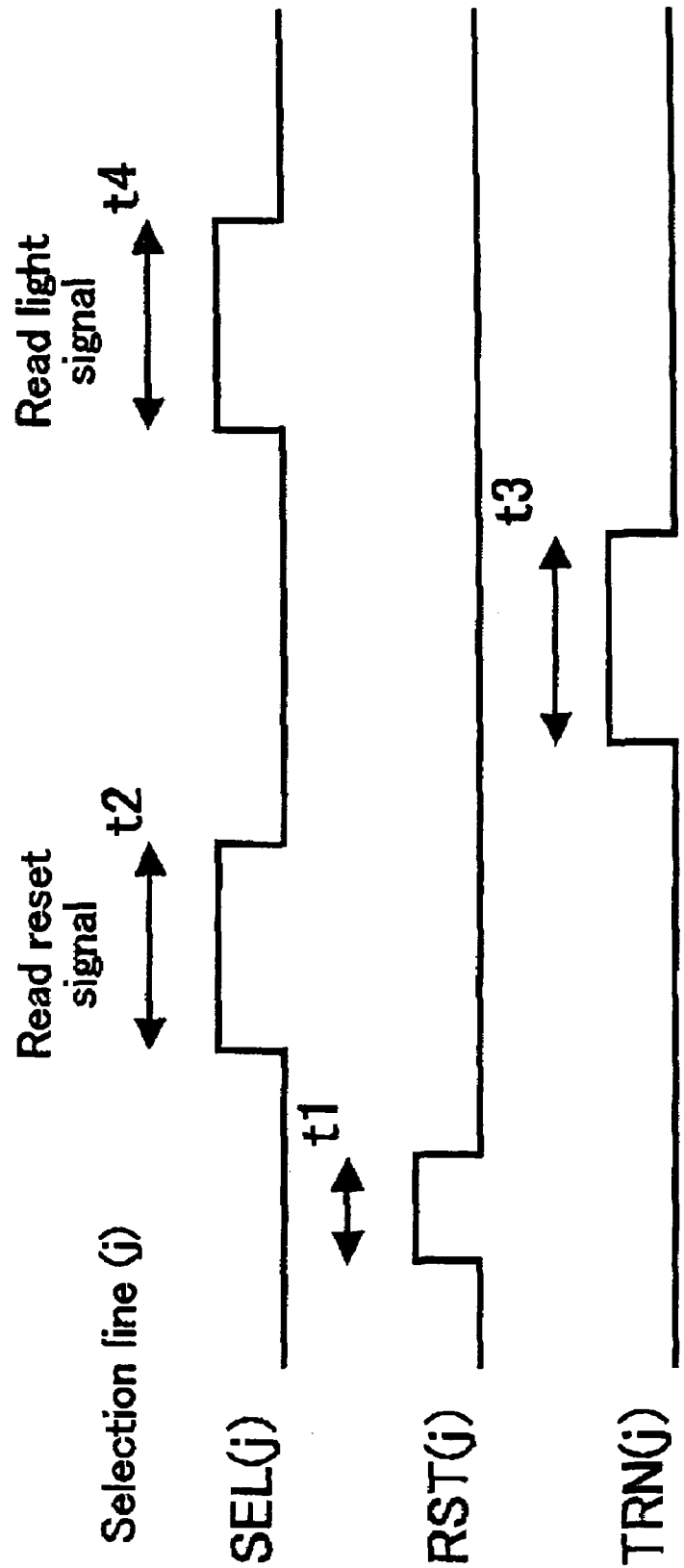
FIG. 14 to a signal waveform diagram showing timings to drive the MOS-type image sensor shown in FIG. 12.
Figure 15:
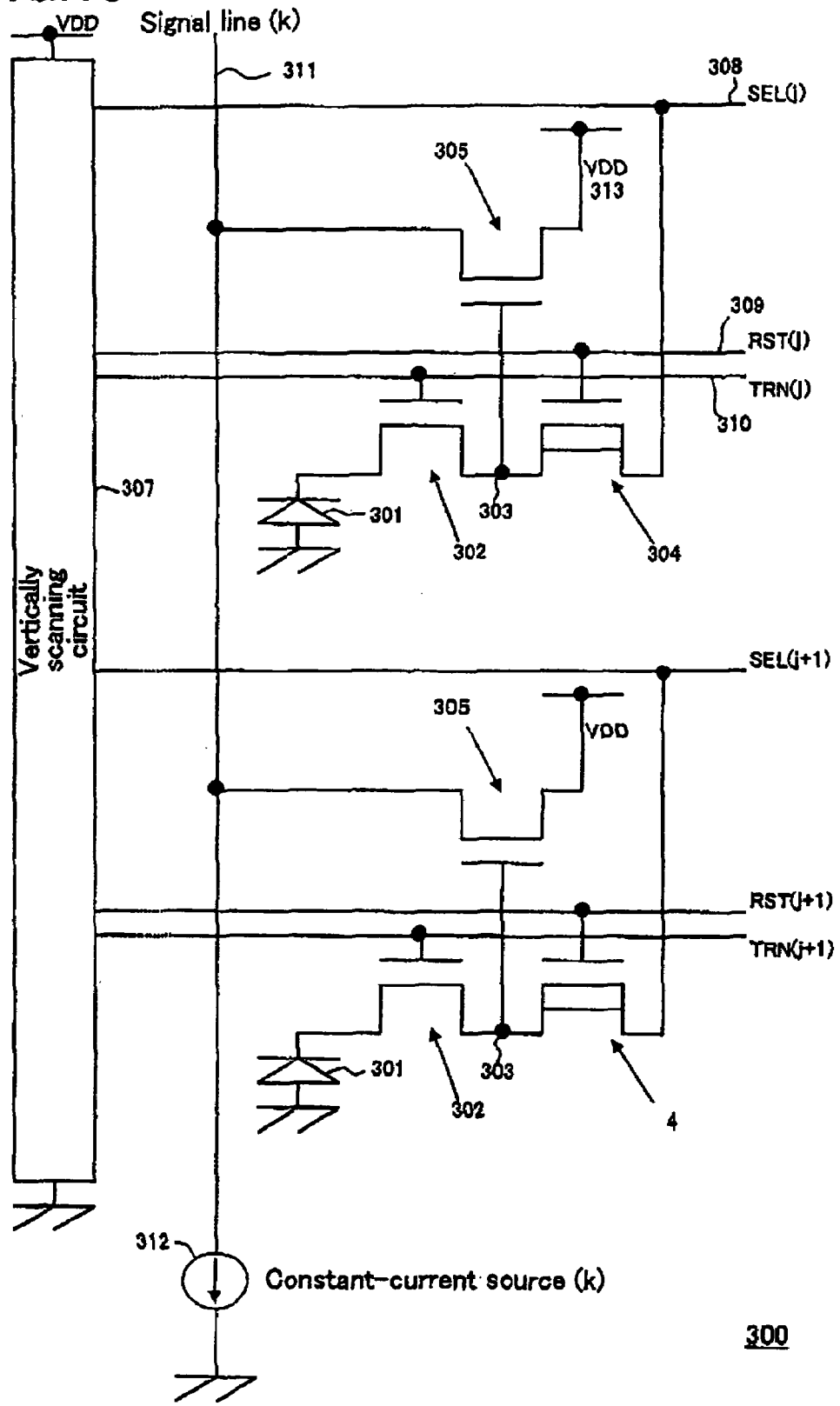
FIG. 15 is a circuit diagram showing a structure of two unit pixel portions (address (k, j) and (k, j+1)) in another conventional MOS-type image sensor.

An described above, according to the MOS-type image sensor 100 of Example 1, it is not necessary to provide the selection transistor 206 as in the conventional MOS-type image sensor 200 shown in FIGS. 12 and 13. Further, it is possible to make the unit pixel portions 30 connected to the line j, to not affect the operation of the unit pixel portions 30 connected to the line j+1. It is also possible to form the unit pixel portions 30 with three transistors for each unit pixel portion.

Figure 16:
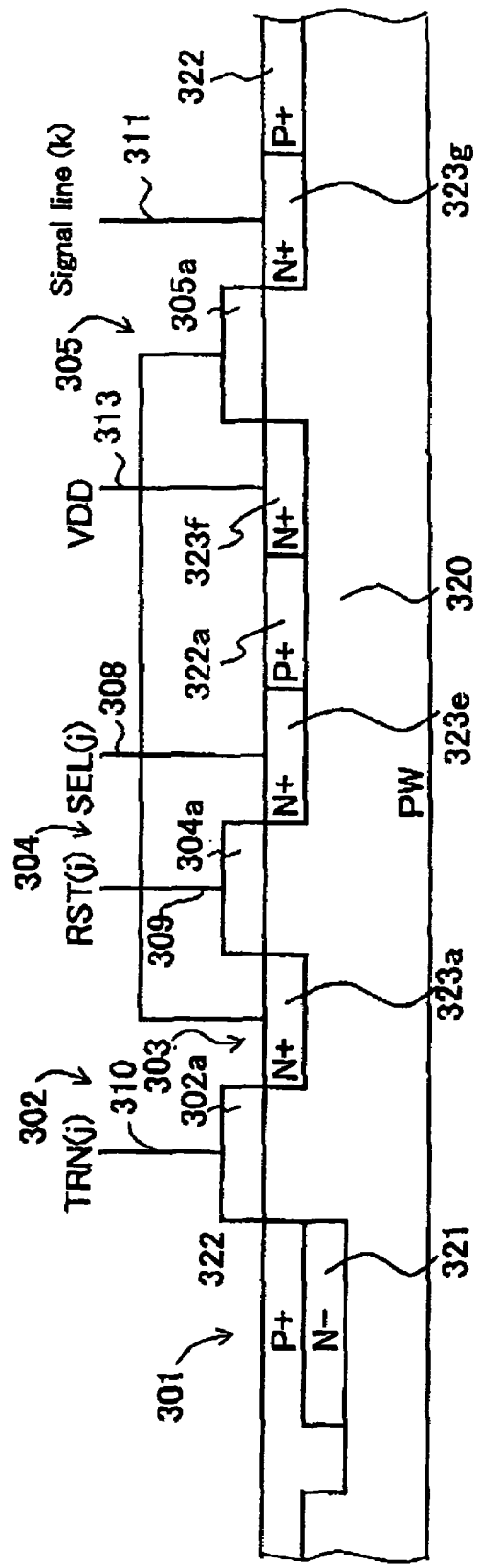
FIG. 16 is a cross-sectional view showing a semiconductor layer structure which corresponds to one of the unit pixel portions in FIG. 15.

Furthermore, as shown in FIG. 2A, in the MOS-type image sensor 100 of Example 1, the drain region 23b is shared by the reset transistor 4 and the amplification transistor 5. The drain region 23b is connected to the vertical selection line 8a to receive a supply of the vertical selection signal SEL from the pixel power supply driving circuit 14. The vertical selection signal SEL can also be used as a pixel power supply voltage VDD. It is not necessary to provide a P-type region for separating the drain region of the reset transistor 4, and the drain region of the amplification transistor 5, as in the conventional MOS-type image sensor 300 shown in FIG. 16. Thus, the size of the area occupied by the transistors can be reduced. Furthermore, the vertical selection line 8a is shared by a plurality of the unit pixel portions 30 arranged along a column direction. For the vertical selection line 8a, it is possible to utilize wiring such as shield metal. Thus, a terminal controlled by the vertically scanning circuit 7 (an output terminal) can be omitted.

As describe above, according to the MOS-type image censor 100 of Example 1, it is possible to increase the size of an area of the photodiode 1, where it receives light, and to improve the sensitivity in imaging.

EXAMPLE 2

Figure 5:
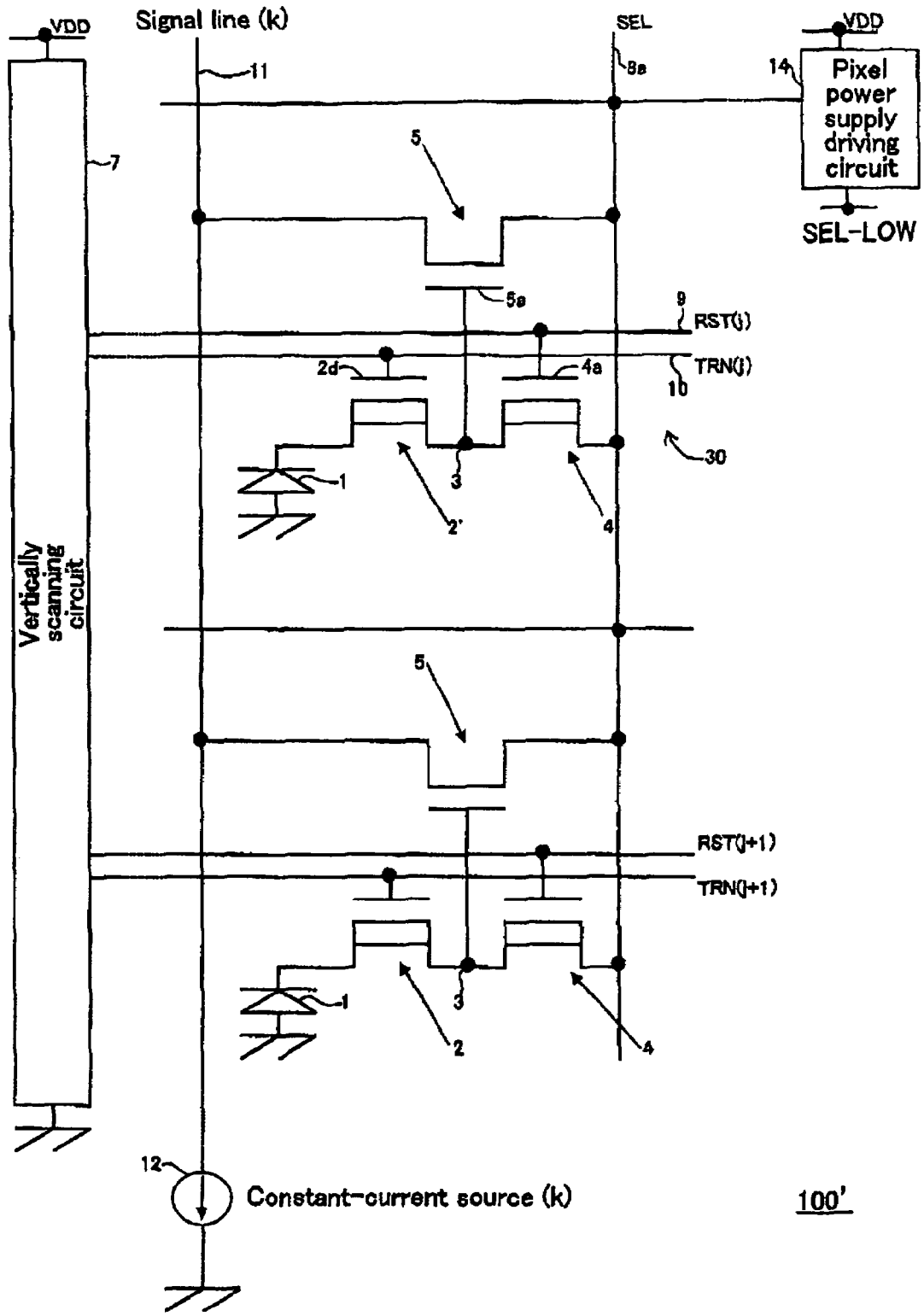
FIG. 5 is a circuit diagram showing structures of two of the unit pixel portions in the MOS-type image sensor according to Example 2 of the present invention.
Figure 6A:
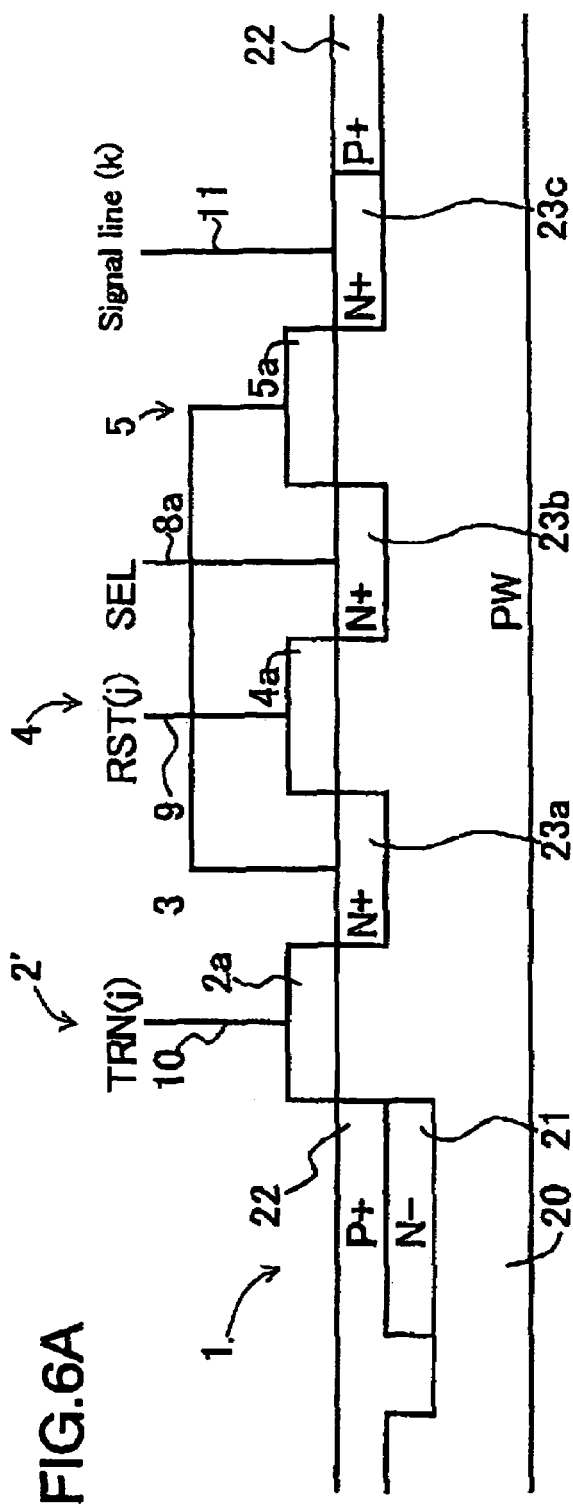
FIG. 6A is a cross-sectional view showing a semiconductor layer structure as shown in FIG. 5.
Figure 6B:
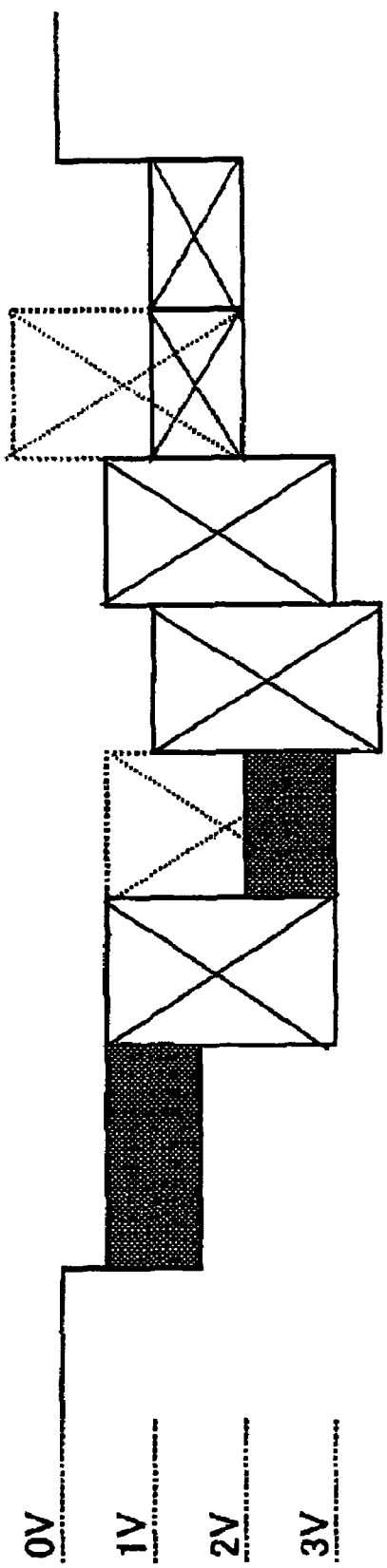
FIG. 6B is a diagram showing potentials which may be taken by the parts shown in FIG. 6A.

FIG. 5 is a circuit diagram showing structures of two of the unit pixel portions in the MOS-type image sensor 100' according to Example 2 of the present invention. The unit pixel portions 30 of FIG. 5 are specified by address (k, j) and (k, j+1). FIG. 6A is a cross-sectional view showing a semiconductor layer structure as shown in FIG. 5. FIG. 6B is a diagram showing potentials which may be taken by the parts shown in FIG. 6A.

As shown in FIGS. 5 and 6A, the MOS-type image sensor 100' is different from the MOS-type image sensor 100 of Example 1 on the following points. The transfer transistor 2' is of the depletion type. A low level of the vertical selection signal SEL is not GND (ground) level, i.e., 0V, but a constant level higher than the GND level, i.e., SEL-LOW. The vertical selection signal SEL is applied to the drain region of the reset transistor 4 from the pixel power supply driving circuit 14 which serves as a driving voltage control section.

As shown in FIG. 6B, in the MOS-type image sensor 100', the potentials under the gate of the transfer transistor 2', the signal storage section 3, and the drain region 23b of the reset transistors 4 and the amplification transistor 5 vary in the range from 0.5V to 3V. The potential under the gate of the amplification transistor 5 varies in the range from −0.5V to 2V.

In the case for imaging an image at a high intensity, & charge photoelectrically converted in the photodiode 1 may excessively be stored. The photodiode 1 has the embedded-type photodiode structure and is provided in the unit pixel portion 30. In such a case, an overflow path for dissipating the excess charge may be provided. In the MOS-type image sensor 100', the overflow path can be implemented by the gate of the transfer transistor 2'.

If the transfer transistor 2' is of the depletion type and the potential when the gate voltage is 0V is 0V or higher, a charge flows through the region under the gate of the transfer transistor 2' to the signal storage section 3 by the excess charge until the potential of the photodiode 1 is decreased and reaches 0V.

When the vertical selection signal SEL is at the high level, i.e., VDD, the signal storage section 3 is further overflowed by the excess charge. The charge flows toward the drain region 23b of the reset transistor 4 through the region under the gate of the rest transistor 4. The reset transistor 4 is connected to the vertical selection line 8a. In order to secure such an overflow path, it is necessary to satisfy the following expression.

Potential under the gate of the reset transistor 4 when the gate voltage thereof is 0V>potential under the gate of the transfer transistor 2' when the gate voltage thereof in 0V . . . (1)

On the other hand, when the vertical selection signal SEL is at the low level, the excess charge flows into the drain region 23b of the reset transistor 4 as it in. The reset transistor 4 is connected to the vertical selection line 8a. In this case, the low level of the vertical selection signal SEL, i.e., SEL-LOW has to be the same as or higher than the potential under the gate of the transfer transistor 2' when the gate voltage thereof is 0V. It is necessary that SEL-LOW satisfies the following two conditions.

SEL-LOW≧potential under the gate of the transfer transistor 2' when the gate voltage thereof is 0V . . . (2), and SEL-LOW<potential under the gate of the reset transistor 4 when the gate voltage thereof is 0V . . . (3)

The above condition (3) is a condition necessary to perform the charge injection into the signal storage section 3 when the vertical selection signal SEL is at the low level.

In Example 2, conditions (1) through (3) are satisfied as follows. The potential under the gate of the reset transistor 4 when the gate voltage thereof is 0V is set to 1V. The potential under the gate of the transfer transistor 2' when the gate voltage thereof is 0V is set to 0.5V. The low level of the vertical selection signal SEL supplied from the pixel power supply driving circuit 14, SEL-LOW, is set to 0.5V.

Next, a method for driving the MOS-type image sensor 100' of Example 2 having the above-described structure will be described.

Figure 8B:
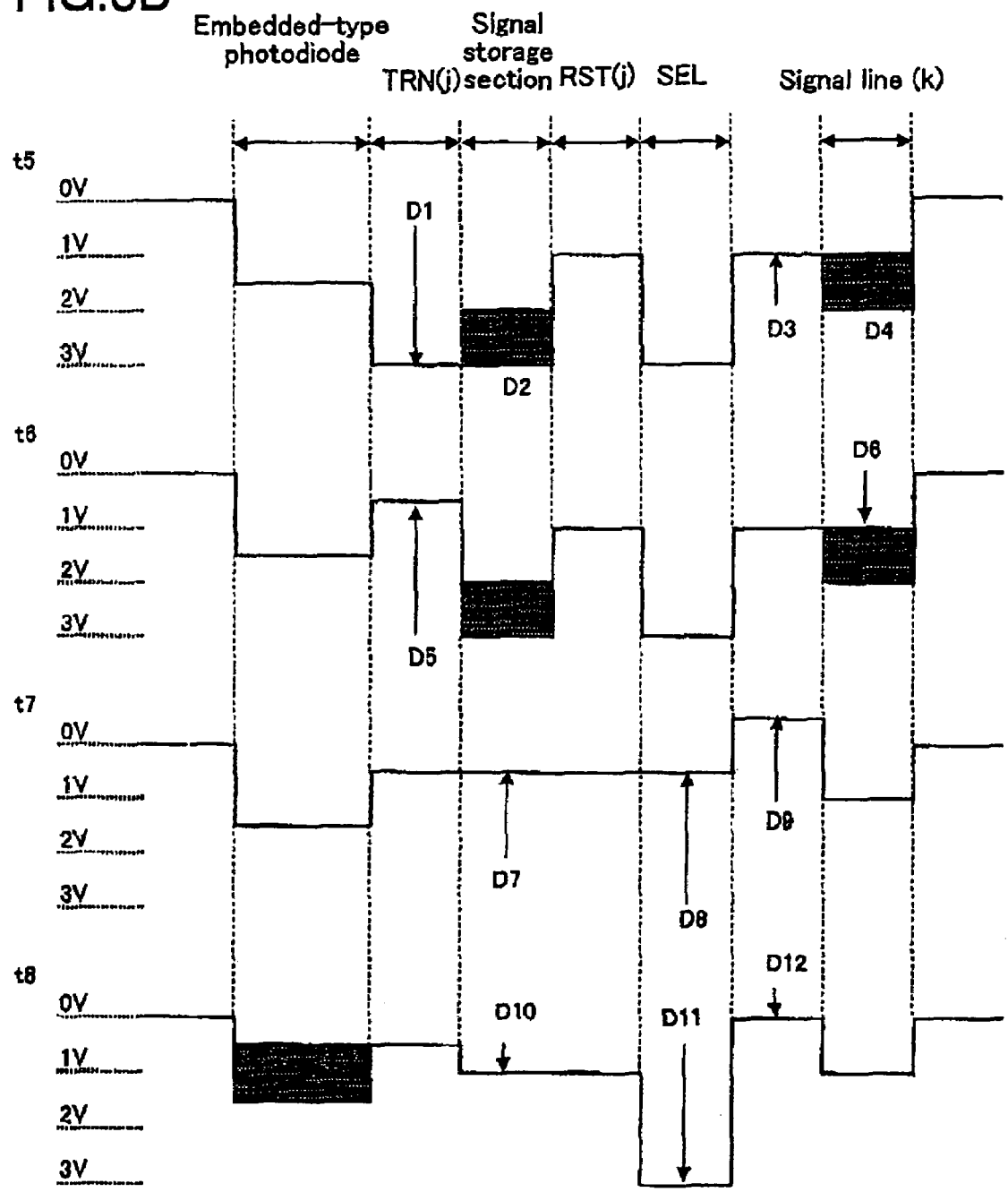
FIG. 8B is a diagram showing potentials at each part at the timings (t5-t8) to drive the MOS-type image sensor shown in FIG. 5.

FIG. 7 is a signal waveform diagram showing timings to drive the MOS-type image sensor 100'. FIGS. 8A and 8B, show potentials at each part shown in FIG. 6, at the timing to drive the MOS-type image sensor 100', as shown in FIG. 7. In this example, during an operation of the MOS-type image sensor 100', a line selected for outputting a light signal is indicated by a line j, and a non-selected line is indicated by a line j+1. An operation of the line j, and changes in the potentials thereof will be described.

As shown in FIGS. 7 and 8A, at time t1, all the control signals (i.e., the vertical selection signal SEL, the reset control signals RST (j) and RST (j+1), and the transfer control signals TRN (j) and TRN (j+1)) are at the low level. In this example, the low level of the vertical selection signal SEL is a predetermined voltage higher than GND (in this example, 0.5V). The reset control signals RST (j) and RST (j+1) and the transfer control signals TRN (j) and TRN (j+1) are at GND level, i.e., 0V.

The vertical selection signal SEL to be applied to the drain region 23b of the reset transistor 4 is SEL-LOW (i.e. the low level, which is 0.5V). From expression (3), the vertical selection signal SEL is set to be lower than 1V, i.e., the potential under the gate of the reset transistor 4 of the depletion type, when the gate voltage thereof is 0V. Thus, a charge is injected into the signal storage section 3 by the vertical selection signal SEL. The potential at the signal storage section 3 also becomes 0.5V.

Since the potential at the signal storage section 3 to 0.5V, the gate voltage of the amplification transistor 5 is 0.5V. As the amplification transistor 5 is of the enhancement type, the signal line (k) 11 is blocked from the unit pixel portion 30 and is in a floating state in terms of potential.

The potential under the gate of the transfer transistor 2' of the depletion type, when the gate voltage thereof 0V, is 0.5V. From expression (2), the low level of the vertical selection signal SEL, SEL-LOW, is set to be 0.5V or higher. When the vertical selection signal SEL is at the low level, SEL-LOW, an excess charge generated at the photodiode 1 flows through the drain region 23a of the reset transistor 4 to the vertical selection line 8a.

Next, at time t2, as indicated by an arrow C3 in FIG. 8A, the vertical selection signal SEL to be applied to the drain region 23b of the reset transistor 4 becomes VDD (i.e.,the high level). Thus, as indicated by an arrow C2, the potential of the region under the gate of the reset transistor 4 of the depletion type, becomes 1V when the gate voltage is 0V.

The potential at the signal storage section 3 is raised by a sub-threshold current flowing through the region under the gate of the reset transistor 4 of the depletion type to the drain region 23b. However, the potential hardly changes in such an amount of time (about a few μs). As indicated by an arrow C1, the potential in maintained at about 1V.

The gate potential of the amplification transistor 5 also becomes 1V at the same time as the signal storage section 3. Since the amplification transistor 5 is of the enhancement type, the potential under the gate of the amplification transistor 5 is about 0V as indicated by an arrow C4. Thus, the signal line (k) 11 remains in the floating state.

The potential under the gate of the reset transistor 4 of the depletion type, when the gate voltage thereof is 0V, is 1V. From expression (1), this is set to be higher than 0.5V, i.e., the potential under the gate of the transfer transistor 2' of the depletion type when the gate voltage thereof is 0V. Thus, when the vertical selection signal SEL is high-level VDD, the excess charge generated in the photodiode 1 flows through the region under the gate of the transfer transistor 2' to the signal storage section 3. The excess charge further passes through the region under the gate of the reset transistor 4, and flows from the drain region 23b of the reset transistor 4 into the vertical selection line 8a.

Next, at time t3, in the selected line j, as indicated by an arrow C6, the reset control signal RST (j) to be applied to the gate electrode 4a of the reset transistor 4 becomes the high level, i.e., VDD. As indicated by an arrow C5, the potential of the signal storage section 3 becomes VDD, i.e., 3V. Thus, the gate voltage of the amplification transistor 5 becomes 3V. As indicated by arrows C7 and C8, the potentials under the gate of the amplification transistor 5 and of the signal line (k) 11 are 2V when the gate voltage of the amplification transistor 5 is 3V.

Further, at time t4, as indicated by an arrow C9, the reset control signal RST (j) to be applied to the gate electrode 4a of the reset transistor 4 is returned to the low level, i.e., 0V. The potential of the signal line (k) 11 as indicated by an arrow C10 becomes an output signal when the pixel portion 30 (address (k, j)) is reset.

Next, at time t5, in the selection line, as indicated by an arrow D1 in FIG. 8B, the transfer control signal TRN to be applied to the gate electrode 2a of the transfer electrode 2' is raised to the high level. Thus, a signal charge is completely transferred from the photodiode 1 to the signal storage section 3. As indicated by an arrow D2, the potential at the signal storage section 3 is reduced by the amount of the transferred signal charge. In this example, the potential in reduced by 1V from 3V to be 2V, as indicated by the hatched pattern.

At the same time, the gate voltage of the amplification transistor 5 is also reduced by 1V. As indicated by arrows D3 and D4, the potential under the gate of the amplification transistor 5 and the potential of signal line (k) 11 are also reduced by 1V. In this example, the potentials are reduced by 1V from 2V to be 2V, as indicated by the hatched pattern.

At time t6, as indicated by an arrow D5, the transfer control signal TRN (j) to be applied to the gate electrode 2a of the transfer electrode 2' is returned to the low level. The potential of the signal line (k) 11 indicated by an arrow D6 is an output signal corresponding to a light signal of the unit pixel portion 30 (address (k, j)).

Next, at time t7, as indicated by an arrow D8, the vertical selection signal SEL to be applied to the drain region 23b of the reset transistor 4 becomes SEL-LOW. As indicated by an arrow D9, from expression (3), SEL-LOW is set to be lower than 1V, i.e., the potential under the gate of the reset transistor 4, of the depletion type, when the gate voltage thereof is 0V. Thus, the charge is injected into the signal storage section 3 by the vertical selection signal SEL. As indicated by an arrow D7, the potential at the signal storage section 3 becomes 0.5V.

Since the potential at the signal storage section 3 is 0.5V, the gate voltage of the amplification transistor 5 also becomes 0.5V. As the amplification transistor 5 is of the enhancement type, the signal line (k) 11 is blocked from the unit pixel portion 30 and is in a floating state in terms of potential. Thus, the potentials return to the state at time t1.

Then, a horizontal scanning period continues for a while. After output signals are read from all the unit pixel portions 30 connected to the line 3, the line j+1 is selected. The time, when the period for which the line j+1 is selected starts, is time t8.

At time t8, in the line j, as in time t2, an indicated by an arrow D11, the vertical selection signal SEL to be applied to the drain region 23b of the reset transistor 4 becomes VDD (i.e., the high level). The potential at the signal storage section 3, is raised by a sub-threshold current flowing through the region under the gate of the reset transistor 4 of the depletion type, to the drain region 23b. However, the potential hardly changes. As indicated by an arrow D10, the potential is maintained at about 1V.

As indicated by an arrow D12, the potential under the gate of the amplification transistor 5 of the enhancement type is about 0V. Since this is lower than the potentials of the signal line (k) 11, and the vertical selection signal SEL, the signal line (k) 11 and the drain region 23b of the amplification transistor 5 can be electrically isolated. Thus, the signal line (k) 11 is blocked from the line j. The signal line (k) 11 can be made free from an influence caused by the operation of the line j.

As described above, according to the MOS-type image sensor 100' of Example 2, in addition to the effects of Example 1, it becomes possible to dissipate the excess charge stored excessively in the photodiode 1 when imaging an image at a high intensity.

Figure 9:
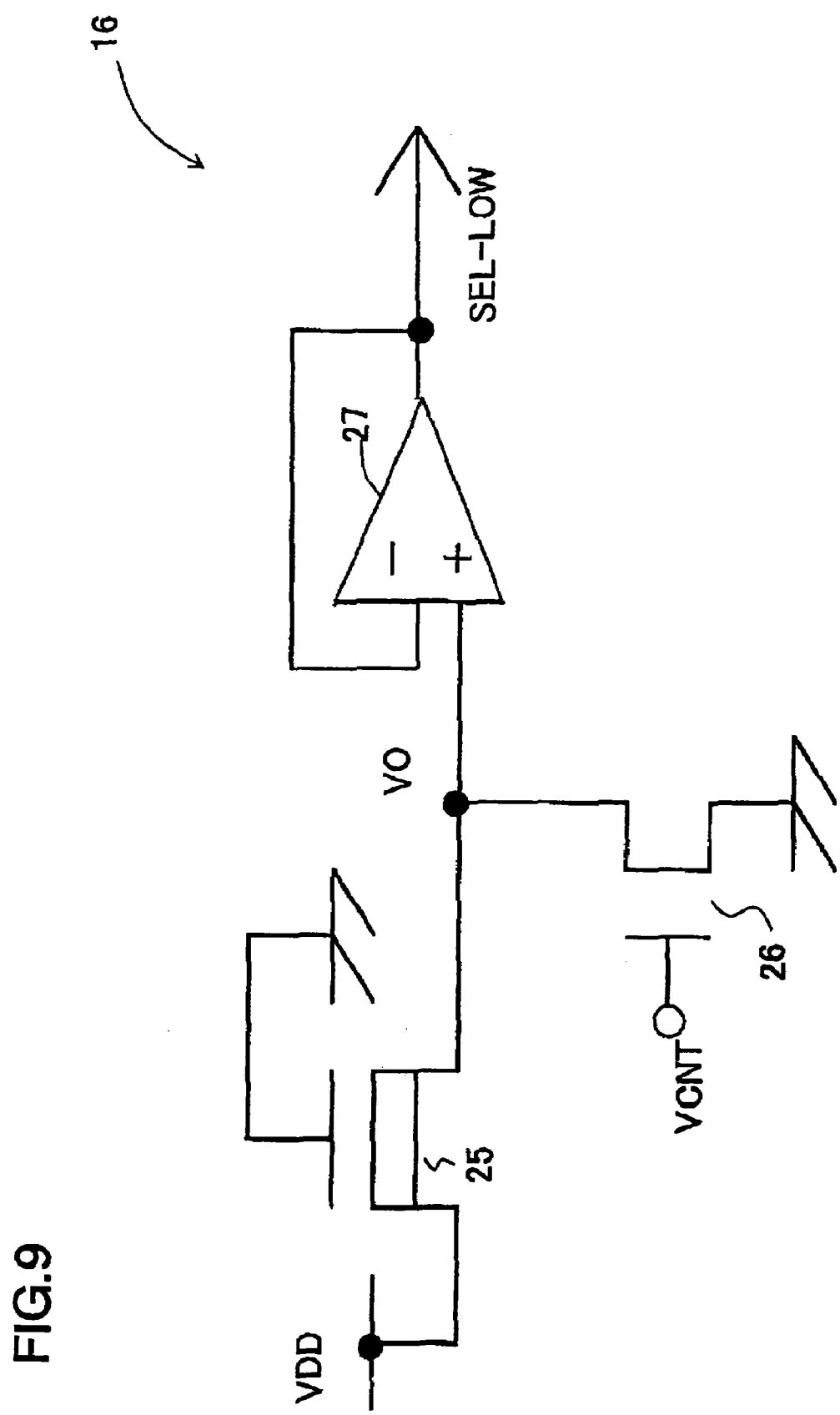
FIG. 9 in a circuit diagram showing a specific example of a structure of a voltage generation circuit in the pixel power supply driving circuit in FIG. 5.

FIG. 9 is a circuit diagram showing a specific example of a structure of a voltage generation circuit 16 in the pixel power supply driving circuit 14. The voltage generation circuit 16 is used for generating the low level SEL-LOW of the vertical selection signal SEL in the MOS-type image sensor 100'.

The voltage generation circuit 16 is provided in the pixel power supply driving circuit 14. The voltage generation circuit 16 includes an amplification transistor 25, a constant-current transistor 26, and a differential amplification circuit 27.

It is necessary that SEL-LOW fulfills the conditions as indicated by expressions (1) through (3). The potentials of the transistors largely vary, depending upon variances in the process. Thus, in the voltage generation circuit 16 shown in FIG. 9, a transistor of the depletion type is used as the amplification transistor 25, to form a source follower circuit. The amplification transistor 25 is same as the reset transistor 4 in the unit pixel portions 30.

A drain region of the amplification transistor 25 is connected to the power supply voltage VDD, and a gate thereof is connected to the ground voltage GND. A source region of the amplification transistor 25 and a drain region of the constant-current transistor 26 are common. A voltage VO at the connection node is input to a plus input terminal of the differential amplification circuit 27. Output voltage SEL-LOW from the differential amplification circuit 27 is fed back to a minus input terminal of the differential amplification circuit 27.

A source region of the constant-current transistor 26 to connected to the ground voltage GND. A control voltage VCNT is applied to a gate of the constant-current transistor 26. The control voltage VCNT applied to the gate of the constant-current transistor 26 controls a value of a constant current which flows through the source follower circuit. Thus, the voltage VO at the connection node between the amplification transistor 25 and the constant-current transistor 26 is controlled. Fine adjustments of the potential of the low-level SEL-LOW of the vertical selection signal SEL output from the differential amplification circuit 27 become possible.

Figure 10:
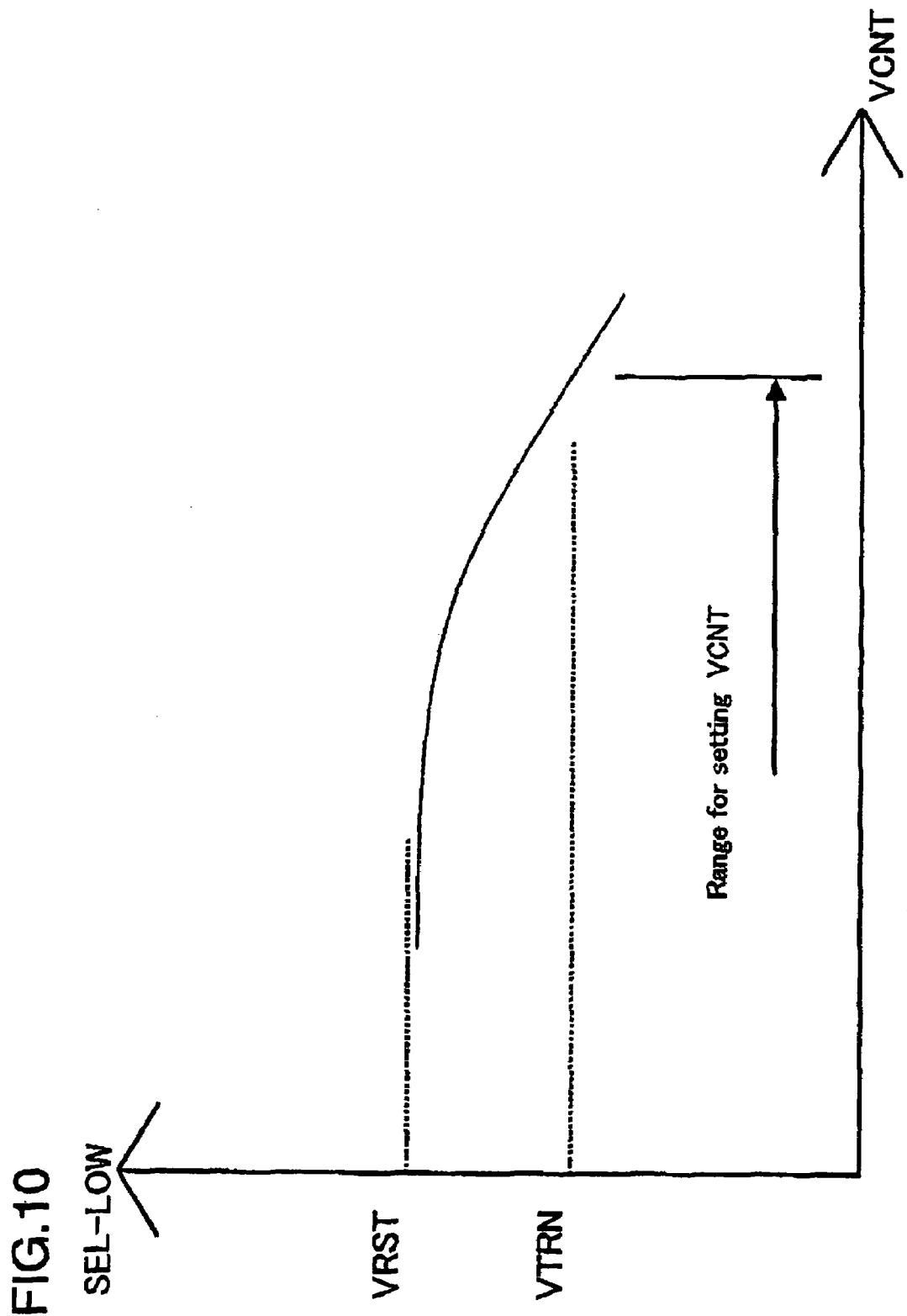
FIG. 10 is a graph showing a relationship between the control voltage VCNT of the constant-current transistor and the voltage SEL-LOW which is output from the differential amplification circuit.

FIG. 10 is a graph showing a relationship between the control voltage VCNT of the constant-current transistor 26 in the voltage generation circuit 16 and the voltage SEL-LOW which is output from the differential amplification circuit 27. In this graph, the vertical axis indicates the output voltage SEL-LOW, and the horizontal axis indicates the gate control voltage VCNT of the constant-current transistor 26. VRST denotes the potential under the gate of the reset transistor 4 when the gate voltage thereof is 0V. VTRN denotes the potential under the gate of the transfer transistor 2' when the gate voltage thereof is 0V.

As shown in FIG. 10, by adjusting a gate control voltage VCNT of the constant-current transistor 26, the output voltage of the differential amplification circuit 27, SEL-LOW, can be set so as to fulfill the conditions defined by expressions (1) through (3), i.e., VTRN<SEL-LOW<VRST.

In the voltage generation circuit formed as described above, even a variance is generated in the potential of the reset transistor 4, due to a variance in the process, similar variance is generated in the potential of the amplification transistor 25 which is a component of the voltage generation circuit. Thus, at least, the output voltage of the differential amplification circuit 27, SEL-LOW, corresponds to the variance in the potential. This makes possible to suppress an influence of the variance in the potential due to the variance in the process.

Regarding the transfer transistor 2 and the reset transistor 4 on the same chip, they are different only in an amount of ion injection. A relative difference in the potentials of these two transistors is very small. Thus, with respect to the variance in the potential of the transfer transistor 2, an influence due to the variance in the process can be similarly adjusted.

EXAMPLE 3

With respect to Example 3, a camera (or a camera system) 150 using the solid-state imaging device according to the present invention as an imaging device will be described.

Figure 11:
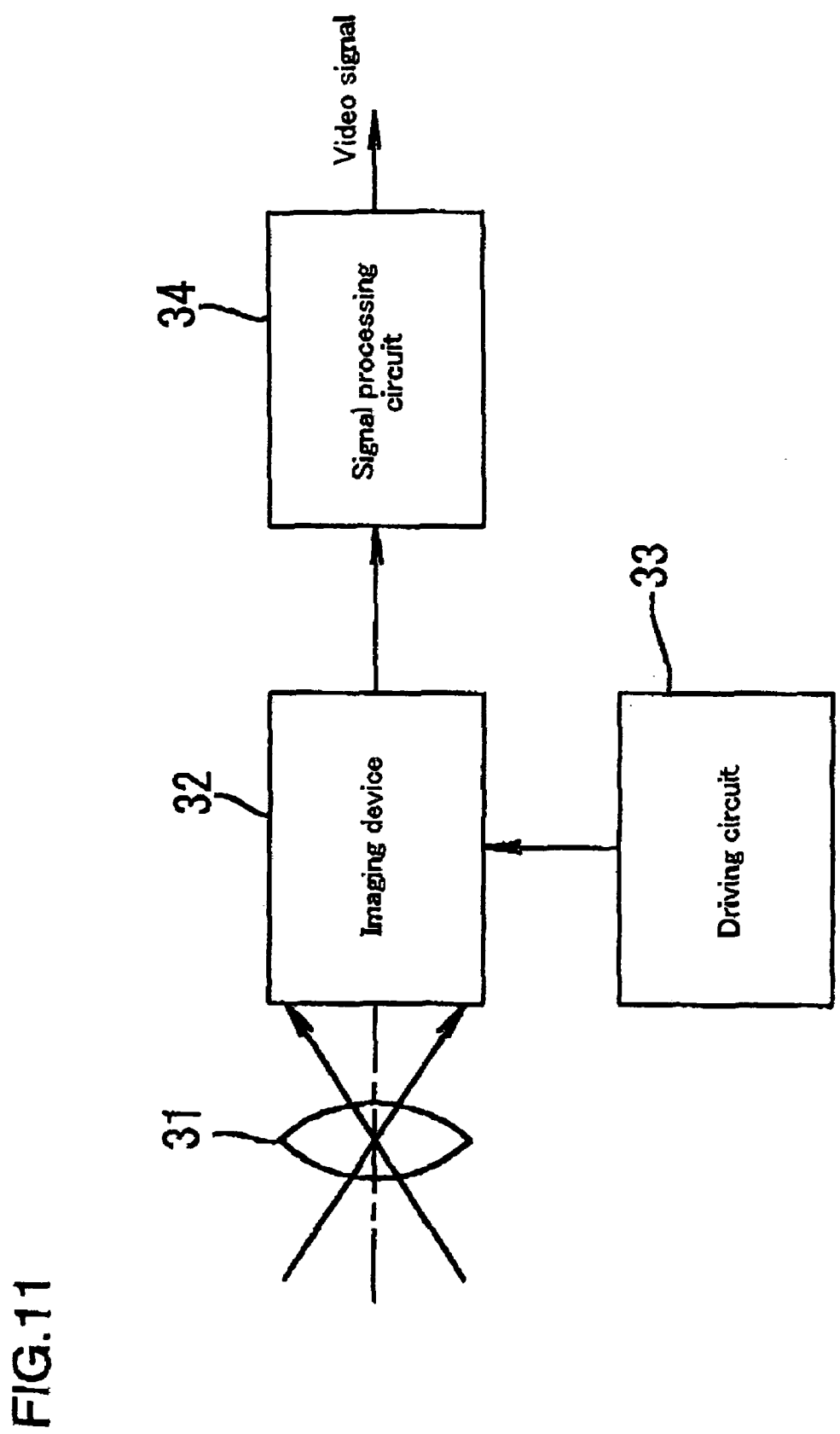
FIG. 11 is a block diagram showing the structure of a camera according to Example 3 of the present invention.

FIG. 11 is a block diagram showing the structure of the camera 150 according to Example 3 of the present invention.

The camera 150 includes an optical system 31, a solid-state imaging device 32, a driving circuit 33, and a signal processing circuit 34. The optical system 31 includes a lens, or the like.

In the camera 150, incident light from an object (not shown) forms an image on an imaging surface of the solid-state imaging device 32 by the optical system 31. The solid-state imaging device 32 may be a MOS-type image sensor as described in Examples 1 and 2.

The solid-state imaging device 32 is driven based on various timing signals which are output from the driving circuit 33. The driving circuit 33 includes a timing generator or the like. The solid-state imaging device 32 outputs an image signal. The image signal is subjected to various signal processes in the signal processing circuit 34, and then, is output as a video signal which is compatible with a display screen.

The camera 150 of Example 3 having the above-described structure employs the solid-state imaging device according to the present invention as the imaging device. Thus, it is possible to achieve a high sensitivity in imaging, and a high quality image can be obtained.

As described above, according to Examples 1 through 3, the solid-state imaging device as follows can be achieved. The solid-state imaging device includes unit pixel portions 30 arranged along a row direction and a column direction in two dimensions. Each of the unit pixel portions 30 includes: a photodiode 1 which has an embedded-type structure and performs photoelectric conversion; a transfer transistor 2 for transferring a charge stored in the photodiode 1; a signal storage section 3 for storing the signal charge transferred by the transfer transistor 2; a reset transistor 4 for dissipating the charge from the signal storage section 3; and an amplification transistor 5 for outputting a signal corresponding to a potential of the signal storage section 3. In such a solid-state imaging device, a pixel power supply driving circuit 14 is provided separately from a vertically scanning circuit 7 which controls gates of the reset transistors 4 and the transfer transistors 2 on a row basis. The pixel power supply driving circuit 14 enables selection of the unit pixel portions 30, on a row basis, by controlling drain voltages to be applied to drain voltage application portions shared by the reset transistors 4, and the amplification transistors 5. Thus, it is possible to use one common drain, for one of the reset transistors and one of the amplification transistors, to reduce the ratio of the area occupied by the transistors in the unit pixel portions 30, and improve the sensitivity in imaging.

According to the present invention, the solid-state imaging device includes a plurality of unit pixel portions. Each of the unit pixel portions includes a photoelectric conversion section, a signal storage section, a transfer section, a reset section, and a signal output section. The plurality of the unit pixel portions are arranged along a row direction and a column direction in two dimensions.

Such a structure allows increasing the size of the area occupied by the photoelectric conversion section compared to that in the conventional art, which requires a selection transistor. Thus, the sensitivity in imaging can be improved.

Further, according to the present invention, the reset section and the signal output section are provided so as to share at least some parts with each other. Thus, the size of an area occupied by the photoelectric conversion section can be increased compared to that in the conventional art which requires a P-type impurity region for separating the signal output section from the reset section. Accordingly, the sensitivity in imaging can be further improved.

According to one example of the present invention, although the present invention employs an embedded-type photo diode structure, each of the unit pixel portions can be formed of three transistors, and a drain of a rest transistor of the reset section and a drain of an amplification transistor of the signal output section can be shared. Thus, it becomes possible to reduce the size of the area occupied by transistors in the unit pixel portions, and increase the size of the area for the photodiode, to improve the sensitivity in the imaging. Accordingly, a high quality image can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state imaging device comprising:
    an imaging section including a plurality of unit pixel portions arranged along a row direction and a column direction, each of the plurality of pixel portions including
        a charge storage section for storing a charge,
            a reset section for resetting the charge storage section,
            a photoelectrical conversion section for photoelectrically converting light to a charge,
        a transfer section for transferring charge from the photoelectrical conversion section to the charge storage section, and
        a signal outputting section for outputting a signal corresponding to the charge stored in the charge storage section, wherein at least a part of the signal outputting section and at least a part of the resetting section are formed in common with one another;
    a vertically scanning section for vertically scanning the plurality of unit pixel portions on a row basis; and
    a driving voltage control section for controlling a driving voltage for driving both said reset section and said signal output section of each of the plurality of unit pixel portions; wherein
    said reset section includes a first control voltage application portion to which a first control voltage is applied by said vertically scanning section and said one-side voltage application portion to which said driving voltage is applied by said driving voltage control section;
    said transfer section includes a second control voltage application portion to which a second control voltage is applied by said vertically scanning section; and
    said signal output section includes said one-side driving voltage application portion to which said driving voltage is applied by said driving voltage control section and a control voltage application portion connected to said charge storage portion;
    such that said first and said second control voltages applied by said vertically scanning section and said driving voltage applied by said driving voltage control section together completely control the pixel units selected and the outputs thereof during a vertical scan of said imaging section.

2. A solid state imaging device according to claim 1, wherein the photoelectric conversion section is formed of a photodiode which generates a charge by irradiation of light.

3. A solid state imaging device according to claim 2, wherein the photodiode has an embedded-type photodiode structure.

4. A solid-state imaging device according to claim 1, wherein:
the transfer section is formed of a transfer transistor;
the reset section is formed of a reset transistor; and
the signal output section is formed of an amplification transistor.

5. A solid-state imaging device according to claim 4, wherein:
the imaging section further includes vertical selection lines, each of said vertical selection lines being shared by the unit pixel portions arranged along an associated column direction among the plurality of unit pixel portions; and
the driving voltage control section is connected to the reset transistor and the amplification transistor of each unit pixel portion in each column via a vertical selection line associated with the column containing the unit pixel portion.

6. A solid-state imaging device according to claim 5, wherein each of the vertical selection lines is formed of a light shielding wiring for shielding irradiation of light.

7. A solid-state imaging device according to claim 4, wherein the driving voltage control section supplies a pixel power supply voltage to the amplification transistor.

8. A solid-state imaging device according to claim 1, wherein the charge storage section is a floating diffusion layer.

9. A solid-state imaging device according to claim 4, wherein the reset transistor is a depletion type transistor.

10. A solid-state imaging device according to claim 4, wherein the transfer transistor is either an enhancement type transistor or a depletion type transistor.

11. A solid-state imaging device according to claim 4, wherein the amplification transistor is an enhancement type transistor.

12. A solid-state imaging device according to claim 4, wherein:
said transfer transistor is provided between a photodiode forming said photoelectric conversion section and said charge storage section;
said reset transistor is provided between a vertical selection line associated with a column of unit pixel portions connected to said driving voltage control section and said charge storage section;
said amplification transistor is provided between a signal line which is connected to a constant current source through which a signal is read out, and said vertical selection line;
said amplification transistor includes a control voltage application portion connected to said charge storage section;
said control voltage application portion of said reset transistor is connected to a reset control line connected to said vertically scanning section; and
said control voltage application portion of said transfer transistor is connected to a transfer control line connected to said vertically scanning section.

13. A solid-state imaging device according to claim 1, wherein the driving voltage control section outputs a voltage signal indicating a level of a binary driving voltage having a power supply voltage level as a high level and a ground voltage level as a low level.

14. A solid-state imaging device according to claim 4, wherein the driving voltage control section outputs a binary voltage signal having a power supply voltage level as a high level, and a constant voltage level, which is higher than a potential under the control application voltage portion of the transfer transistor when the control voltage thereof is 0V and which is lower than a potential under the control voltage application portion of the reset transistor when the control voltage thereof is 0V.

15. A solid-state imaging device according to claim 4, wherein the driving voltage control section comprises a voltage generation circuit having: a source follower circuit formed of a transistor that is the same as the reset transistor; and a differential amplification circuit.

16. A solid-state imaging device according to claim 15, wherein the voltage generation circuit generates a constant voltage level.

17. A method for driving a solid-state imaging device, wherein the solid state imaging device comprises:
an imaging section including a plurality of unit pixel portions arranged along a row direction and a column direction, each of the plurality of pixel portions including
a charge storage section for storing a charge,
a reset section for resetting the charge storage section,
a photoelectrical conversion section for photoelectrically converting light to a charge,
a transfer section for transferring charge from the photoelectrical conversion section to the charge storage section, and
a signal outputting section for outputting a signal corresponding to the charge stored in the charge storage section, wherein at least a part of the signal outputting section and at least a part of the resetting section are formed in common with one another;
a vertically scanning section for vertically scanning the plurality of unit pixel portions on a row basis; and
a driving voltage control section for controlling a driving voltage for driving both said reset section and said signal output section of each of the plurality of unit pixel portions; wherein
said reset section includes a first control voltage application portion to which a first control voltage is applied by said vertically scanning section and said one-side voltage application portion to which said driving voltage is applied by said driving voltage control section;
said transfer section includes a second control voltage application portion to which a second control voltage is applied by said vertically scanning section; and
said signal output section includes said one-side driving voltage application portion to which said driving voltage is applied by said driving voltage control section and a control portion connected to said charge storage section;
such that said first and said second control voltages applied by said vertically scanning section and said driving voltage applied by said driving voltage control section together completely determine the pixel units selected and the outputs thereof during a vertical scan of said imaging section;
the method comprising the steps of:
resetting the charge storage section;
outputting a signal corresponding to the charge stored in the charge storage section;
storing the charge photoelectrically converted by the photoelectric conversion section by transferring the same via the transfer section into the charge storage section; and outputting a signal corresponding to the charge photoelectrically converted by the photoelectrical conversion section and stored in the charge storage section, wherein the steps of storing the charge in the charge storage section and resetting, include the step of controlling the driving voltage for driving the reset section and the signal output section by the driving voltage control section to select unit pixel portions on a row basis.

18. A camera comprising an imaging device, wherein the imaging device is an imaging section including a plurality of unit pixel portions arranged along a row direction and a column direction, each of the plurality of pixel portions including a charge storage section for storing a charge, a reset section for resetting the charge storage section, a photoelectrical conversion section for photoelectrically converting light to a charge, a transfer section for transferring charge from the photoelectrical conversion section to the charge storage section, and a signal outputting section for outputting a signal corresponding to the charge stored in the charge storage section, wherein at least a part of the signal outputting section and at least a part of the resetting section are formed in common with one another;

a vertically scanning section for vertically scanning the plurality of unit pixel portions on a row basis; and a driving voltage control section for controlling a driving voltage for driving both said reset section and said signal output section of each of the plurality of unit pixel portions; wherein said reset section includes a first control voltage application portion to which a first control voltage is applied by said vertically scanning section and said one-side voltage application portion to which said driving voltage is applied by said driving voltage control section;

said transfer section includes a second control voltage application portion to which a second control voltage is applied by said vertically scanning section; and said signal output section includes said one-side driving voltage application portion to which said driving voltage is applied by said driving voltage control section and a control voltage application portion connected to said charge storage portion;

such that said first and said second control voltages applied by said vertically scanning section and said driving voltage applied by said driving voltage control section together completely determine the pixel units selected and the outputs thereof during a vertical scan of said imaging section.

* * * * *